United States Patent
Lin et al.

(10) Patent No.: US 12,033,949 B2
(45) Date of Patent: *Jul. 9, 2024

(54) PACKAGE STRUCTURE WITH BRIDGE DIE LATERALLY WRAPPED BY INSULATING ENCAPSULANT AND SURROUNDED BY THROUGH VIAS AND METHOD OF FORMING THE PACKAGE STRUCTURE

(71) Applicant: Taiwan Semiconductor Manufacturing Company, Ltd., Hsinchu (TW)

(72) Inventors: Yu-Hung Lin, Taichung (TW); Chih-Wei Wu, Yilan County (TW); Chia-Nan Yuan, Hsinchu (TW); Ying-Ching Shih, Hsinchu (TW); An-Jhih Su, Taoyuan (TW); Szu-Wei Lu, Hsinchu (TW); Ming-Shih Yeh, Hsinchu County (TW); Der-Chyang Yeh, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/960,767

(22) Filed: Oct. 5, 2022

(65) Prior Publication Data

US 2023/0036283 A1 Feb. 2, 2023

Related U.S. Application Data

(63) Continuation of application No. 17/148,568, filed on Jan. 14, 2021, now Pat. No. 11,482,497.

(51) Int. Cl.
*H01L 23/538* (2006.01)
*H01L 21/56* (2006.01)
(Continued)

(52) U.S. Cl.
CPC .......... *H01L 23/5389* (2013.01); *H01L 21/56* (2013.01); *H01L 21/76898* (2013.01);
(Continued)

(58) Field of Classification Search
CPC ............... H01L 21/56; H01L 21/76898; H01L 23/5381; H01L 24/11; H01L 24/13;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Khiem D Nguyen
(74) *Attorney, Agent, or Firm* — JCIPRNET

(57) ABSTRACT

A package structure and method of forming the same are provided. The package structure includes a first die and a second die disposed side by side, a first encapsulant laterally encapsulating the first and second dies, a bridge die disposed over and connected to the first and second dies, and a second encapsulant. The bridge die includes a semiconductor substrate, a conductive via and an encapsulant layer. The semiconductor substrate has a through substrate via embedded therein. The conductive via is disposed over a back side of the semiconductor substrate and electrically connected to the through substrate via. The encapsulant layer is disposed over the back side of the semiconductor substrate and laterally encapsulates the conductive via. The second encapsulant is disposed over the first encapsulant and laterally encapsulates the bridge die.

20 Claims, 23 Drawing Sheets

(51) Int. Cl.
*H01L 21/768* (2006.01)
*H01L 23/00* (2006.01)
*H01L 23/29* (2006.01)
*H01L 23/31* (2006.01)
*H01L 23/48* (2006.01)

(52) U.S. Cl.
CPC ........ *H01L 23/295* (2013.01); *H01L 23/3135* (2013.01); *H01L 23/481* (2013.01); *H01L 23/5381* (2013.01); *H01L 24/11* (2013.01); *H01L 24/13* (2013.01); *H01L 24/14* (2013.01); *H01L 24/16* (2013.01); *H01L 24/24* (2013.01); *H01L 24/25* (2013.01); *H01L 24/82* (2013.01); *H01L 2224/11462* (2013.01); *H01L 2224/13025* (2013.01); *H01L 2224/14181* (2013.01); *H01L 2224/16145* (2013.01); *H01L 2224/24105* (2013.01); *H01L 2224/24146* (2013.01); *H01L 2224/25171* (2013.01); *H01L 2224/25174* (2013.01); *H01L 2224/2518* (2013.01); *H01L 2224/82101* (2013.01)

(58) Field of Classification Search
CPC ......... H01L 24/14; H01L 24/16; H01L 24/24; H01L 24/25; H01L 24/82; H01L 2224/214; H01L 2224/13025; H01L 23/3135; H01L 23/481; H01L 23/49816; H01L 23/5384
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,797,022 B2 * | 10/2020 | Fang ................ H01L 25/0655 |
| 11,482,497 B2 * | 10/2022 | Lin .................. H01L 21/568 |
| 2020/0006251 A1 * | 1/2020 | Chen ................ H01L 23/5381 |
| 2020/0176384 A1 * | 6/2020 | Wu .................. H01L 21/4857 |
| 2020/0212006 A1 * | 7/2020 | Chang ................ H01L 25/50 |
| 2020/0411333 A1 * | 12/2020 | Yu .................. H01L 23/3171 |
| 2021/0050327 A1 * | 2/2021 | Shih ................ H01L 23/49838 |

* cited by examiner

PACKAGE STRUCTURE WITH BRIDGE DIE LATERALLY WRAPPED BY INSULATING ENCAPSULANT AND SURROUNDED BY THROUGH VIAS AND METHOD OF FORMING THE PACKAGE STRUCTURE

CROSS-REFERENCE TO RELATED APPLICATION

This application is a continuation application of and claims the priority benefit of U.S. patent application Ser. No. 17/148,568, filed on Jan. 14, 2021, issued as U.S. Pat. No. 11,482,497. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), integrated fan-out packages, wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
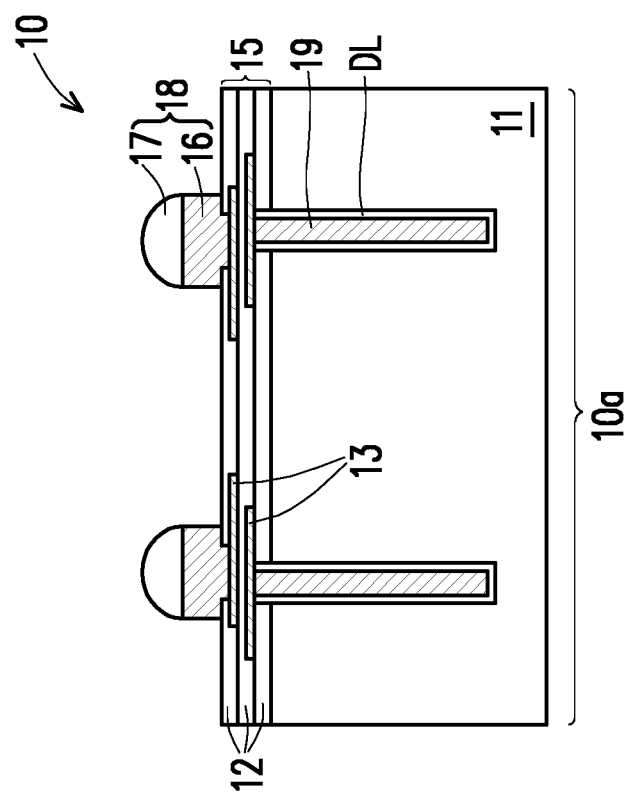
FIG. 1A to FIG. 1G are cross-sectional views illustrating a method of forming a die according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are cross-sectional views illustrating a method of forming a die according to some embodiments of the disclosure.

Referring to FIG. 1A, in some embodiments, a wafer 10 including a plurality die regions is provided. A plurality of dies 10a are disposed within the die regions of the wafer 10. The plurality of dies 10a may be arranged in an array and spaced apart from each other by scribe regions therebetween. It is noted that, for the sake of brevity, one die 10a disposed in one die region of the wafer 10 is illustrated. The wafer 10 may include any suitable number of dies therein. In some embodiments, the die 10a may also be referred to as an initial die.

The wafer 10 may be a semiconductor wafer, and the dies 10a are semiconductor dies. In some embodiments, the dies 10a are used for forming bridge dies connecting different device dies in packaging process. One of the dies 10a is described in detail as below, and it should be understood that the other ones of the dies 10a included in the wafer 10 have similar structures.

Still referring to FIG. 1A, in some embodiments, the die 10 includes a substrate 11, an interconnection structure 15 disposed over the substrate 11, a plurality of connectors 18 disposed on the interconnection structure 15, and a plurality of conductive vias 19. The substrate 11 may be a semiconductor substrate such as a silicon substrate or a semiconductor-on-insulator (SOI) substrate. In some embodiments, the substrate 11 is an undoped silicon substrate. However, the disclosure is not limited thereto. In alternative embodiments, the substrate 11 may be a doped silicon substrate. The doped silicon substrate may be P-type doped, N-type doped, or a combination thereof.

In some embodiments, the die 10a is free of (active and/or passive) devices disposed on and/or in the substrate 11, but the disclosure is not limited thereto. In alternative embodiments, the dies 10a may include active devices and/or passive devices therein.

The interconnection structure 15 is formed on the substrate 11, and may include a dielectric structure 12 and a plurality conductive features 13. The dielectric structure 12 may be a multi-layer structure including a plurality of dielectric layers. The material of the dielectric structure 12 may include silicon oxide, silicon nitride, silicon oxynitride, undoped silicate glass (USG), phosphosilicate glass (PSG), borosilicate glass (BSG), boron-doped phosphosilicate glass (BPSG), the like or combinations thereof.

The conductive features 13 are embedded in the dielectric structure 12, and may include multi-layers of conductive lines and conductive vias (not shown) electrically connected to each other. The conductive features 13 may also be referred to as interconnect wirings. The conductive features 13 may include suitable conductive materials, such as metal, metal alloy or a combination thereof. For example, the conductive material may include tungsten (W), copper (Cu), copper alloys, aluminum (Al), aluminum alloys, or combinations thereof.

The connectors 18 are formed on the interconnection structure 15 and electrically connected to the conductive features 13. In some embodiments, the connector 18 may land on a topmost conductive feature (e.g., conductive line) of the conductive features 13, but the disclosure is not limited thereto. In alternative embodiments, the connector 18 may land on a conductive feature at a tier lower than the topmost conductive feature of the conductive features 13. In some other embodiments, the connector 18 may land on a conductive pad disposed on the topmost conductive features of the conductive features 13 and electrically connected to the conductive features 13 through the conductive pad. The connectors 18 are used for external connection and may also be referred to as conductive terminals of the die 10a.

Figure 3A:
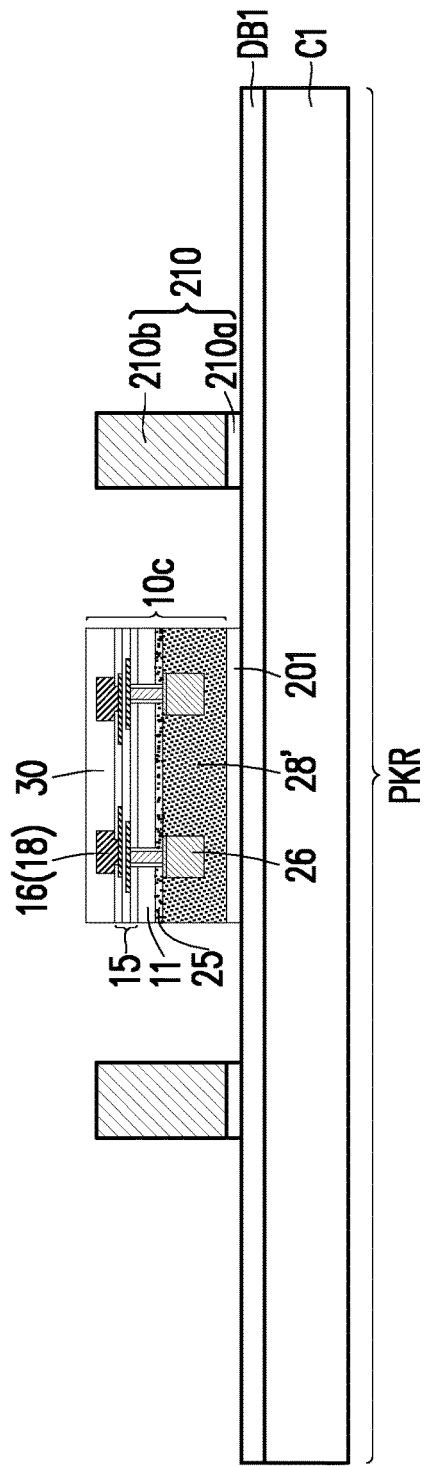
FIG. 3A to FIG. 3H are cross-sectional views illustrating a method of forming a package structure according to some embodiments of the disclosure.

In some embodiments, the connectors 18 may each include a conductive post 16 and a conductive cap 17 disposed on the conductive post 16. The conductive posts 16 may include gold bump, copper bump, copper post, copper pillars, or the like or combinations thereof. The conductive caps 17 may include solder caps, or the like. Other suitable metallic cap may also be used. In some embodiments, the conductive post 16 includes a via portion embedded in the dielectric structure 12 and a post portion protruding from the top surface of the dielectric structure 12. The conductive cap 17 at least covers the top surface of the conductive post 16. In some embodiments, the conductive cap 17 may further extend to cover the sidewall of the conductive post 16. In some other embodiments, for example, as shown in FIG. 3A, the connector 18 may include the conductive post 16 and may be free of the conductive cap 17, and a passivation layer may be further disposed on the interconnection structure 15 to cover the connectors 18.

Still referring to FIG. 1A, in some embodiments, the die 10a includes a plurality of conductive vias 19 embedded in the substrate 11 and electrically connected to the conductive features 13 of the interconnection structure 15. The conductive vias 19 may extend into the interconnection structure 15 to be in physical and electrical contact with the conductive features 13 of the interconnection structure 15. In some embodiments, the conductive vias 19 have dielectric liners DL covering surfaces thereof. The dielectric liner DL is disposed between the respective conductive via 19 and the substrate 11 to separate the respective conductive via 19 from the substrate 11. The dielectric liner DL may surround the sidewalls and bottom surface of the conductive via 19.

The conductive via 19 may include copper, copper alloys, aluminum, aluminum alloys, Ta, TaN, Ti, TiN, Co, W or combinations thereof. The dielectric liner include a suitable dielectric material, such as silicon oxide, silicon nitride, silicon oxynitride or the like, or combinations thereof.

Figure 1B:
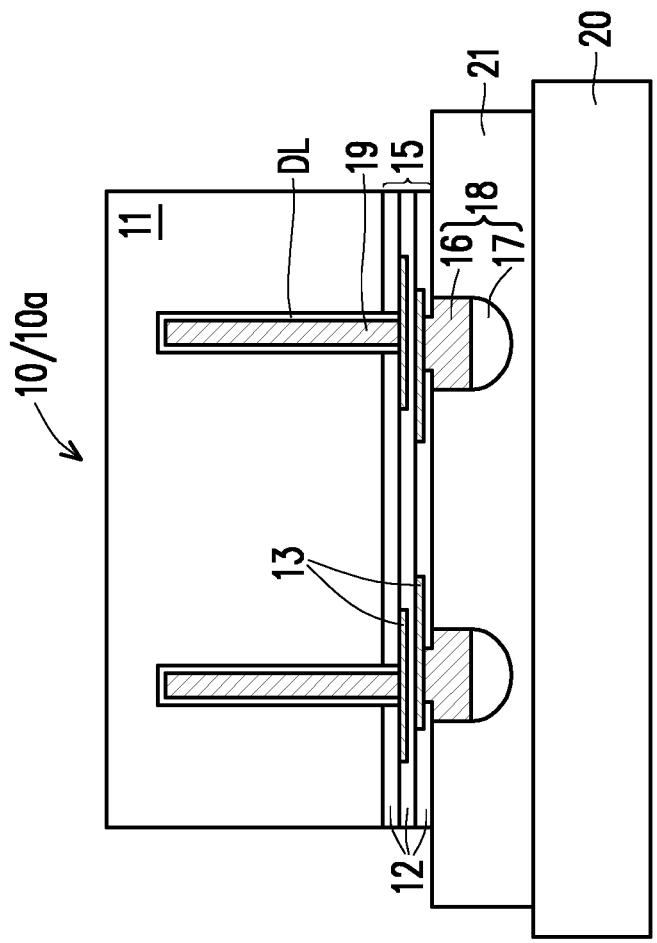

Referring to FIG. 1A and FIG. 1B, in some embodiments, the wafer 10 is flipped upside down and disposed on a carrier 20. The carrier 20 may be a glass carrier, a ceramic carrier, or the like. In some embodiments, the wafer 10 is attached to the carrier 20 through a tape 21, which may be an adhesive tape, die attach film, or the like.

Figure 1C:
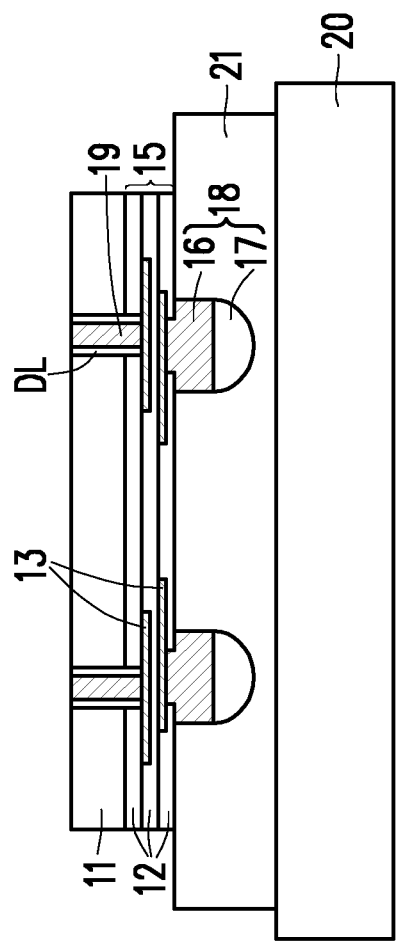

Referring to FIG. 1B and FIG. 1C, a planarization process is performed to at least remove a portion of the substrate 11 on the top surface of the conductive via 19, such that the conductive via 19 is exposed. The planarization process may include a grinding process, a chemical mechanical polishing (CMP) process, or the like or combinations thereof. Through the planarization process, the substrate 11 is thinned down, and therefore, the planarization process may also be referred to as a thinning process. In some embodiments, the dielectric liner DL covering the top surface of the conductive via 19 is also removed by the planarization process, such that the top surface of the conductive via 19 is exposed. In some embodiments, the conductive vias 19 are substantially not removed during the planarization process, but the disclosure is not limited thereto. In some other embodiments, the planarization process may further remove portions of the conductive vias 19, portions of the dielectric liners DL and another portion of the substrate 11 laterally aside the portions of the conductive vias 19, such that the heights of the conductive vias 19 are reduced.

Referring to FIG. 1C, in some embodiments, after the planarization process is performed, the top surfaces of the conductive vias 19, the top surfaces of the dielectric liners DL and the top surface (i.e., back surface) of the substrate 11 may be substantially coplanar or level with each other. In other words, the conductive vias 19 penetrate through the substrate 11 and are accessibly exposed for further electrical connection. In some embodiments, the conductive vias 19 may also be referred to as through substrate vias (TSVs). Herein, throughout the disclosure, a "back surface" of a substrate refers to a surface of the substrate opposite to a "front surface" of the substrate on which the interconnection structure and connectors are formed.

Figure 1D:
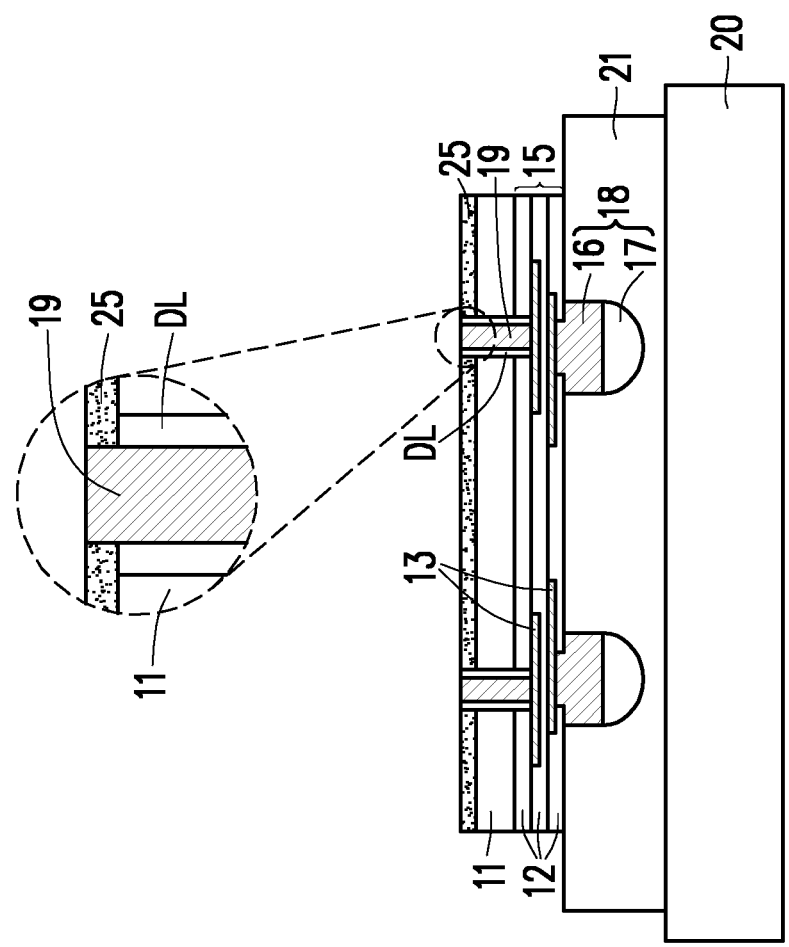

Referring to FIG. 1C and FIG. 1D, in some embodiments, the substrate 11 is further recessed, such that the TSVs 19 protrude from the top surface of the substrate 11. For example, a portion of the substrate 11 laterally aside the top portions of the TSVs 19 may be removed by an etching process, such as wet etching process, dry etching process, or a combination thereof. The etching process has a high etching selectivity ratio between the substrate 11 and the conductive vias 19, such that the conductive vias 19 are substantially not removed during the recessing process. The etching process may also have a high etching selectivity ratio between the substrate 11 and the dielectric liners DL, and the dielectric liners DL are substantially not removed during the recessing process, but the disclosure is not limited thereto. In some other embodiments, as shown in the enlarged view, a portion of the dielectric liner DL may be removed along with the substrate 11 during the recessing process.

Referring to FIG. 1D, after the recessing process is performed, portions of the TSVs 19 protrudes above the top surface (i.e., back surface) of the substrate 11. In some embodiments, an isolation layer 25 is then formed on the substrate 11 and laterally aside the portions of the TSVs 19 protruding above the substrate 11. The isolation layer 25 may include a dielectric material such as silicon nitride, although other dielectric materials such as silicon oxide, silicon carbide, silicon nitride, silicon oxynitride, oxygen-doped silicon carbide, nitrogen-doped silicon carbide, a polymer, which may be a photo-sensitive material such as PBO, polyimide, or BCB, a low-K dielectric material such as PSG, BPSG, FSG, SiOxCy, SOG, spin-on polymers, silicon carbon material, compounds thereof, composites thereof, combinations thereof, or the like may also be used for the isolation layer 25. In some embodiments, the isolation layer 25 may be formed by forming an isolation material layer on the substrate 11 to cover sidewalls and top surfaces of the protruding portions of the TSVs 19 over the top surface of the substrate 11. The isolation material layer may be formed using a suitable deposition process, such as CVD, atomic layer deposition (ALD), or the like. In some embodiments, the isolation material layer may be a conformal layer. Thereafter, a planarization process, such as a CMP process is performed to remove excess portions of the isolation material layer over the top surfaces of the TSVs 19, such that the top surfaces TSVs 19 are revealed. In some embodiments, the top surfaces of the TSVs 19 and the top surface of the isolation layer 25 are substantially coplanar or level with each other.

In some embodiments in which the dielectric liners DL are substantially not removed during the above-described recessing process, portions of the dielectric liners DL may be laterally sandwiched between the isolation layer 25 and the TSVs 19. In some alternative embodiments in which the dielectric liners DL are partially removed during the recessing process (as shown in the enlarged view), the isolation layer 25 may extend to contact the sidewalls of the TSVs 19 and cover the top surfaces of the dielectric liners DL.

Figure 1E:
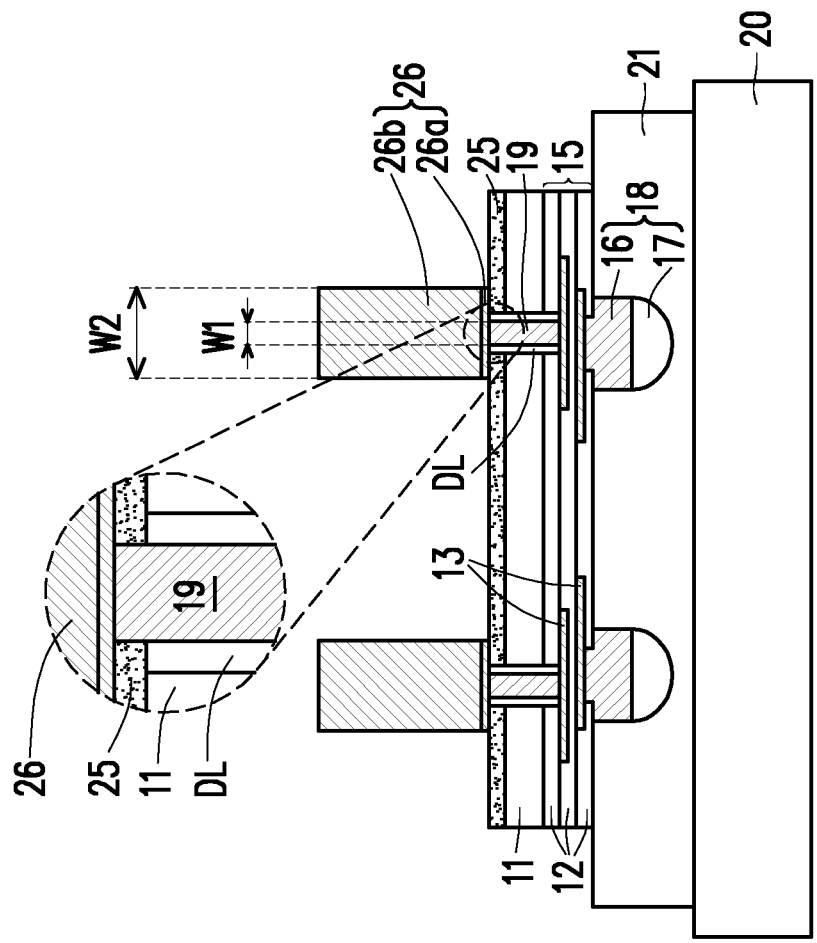

Referring to FIG. 1E, in some embodiments, a plurality of conductive vias 26 are then formed on the isolation layer 25 to electrically connect to the TSVs 19. In some embodiments, the conductive via 26 includes a seed layer 26a and a conductive post 26b on the seed layer 26a. The seed layer 26a is a metal seed layer such as a copper seed layer. For example, the seed layer 26a may include titanium, copper, the like, or a combination thereof. In some embodiments, the seed material layer 26a includes a first metal layer such as a titanium layer and a second metal layer such as a copper layer over the first metal layer. The conductive post 26b includes a suitable metal, such as copper. The sidewalls of the conductive posts 26b may be substantially aligned with the sidewalls of the seed layer 26a. The sidewalls of the conductive via 26 may be substantially straight, inclined, arced or the like. However, the disclosure is not limited thereto.

In some embodiments, the conductive vias 26 may be formed by the following processes: a seed material layer is formed on the isolation layer 25 and the TSVs 16 by a physical vapor deposition (PVD) process such as sputtering. A patterned mask layer is then formed on the seed material layer, the patterned mask layer has a plurality of openings exposing a portion of the seed material layer at the intended locations for the subsequently formed conductive vias 26. Thereafter, the conductive posts 26b are formed on the seed material layer within the openings by a plating process, such as electroplating. Thereafter, the patterned mask layer is stripped by an ashing process, for example. The seed material layer not covered by the conductive posts 26b is removed by an etching process using the conductive posts 26b as the etching mask. As such, the seed layers 26a underlying the conductive posts 26b are remained, the seed layers 26a and the conductive posts 26b constitute the conductive vias 26. It is noted that, the forming method of the conductive vias 26 described above is merely for illustration, and the disclosure is not limited thereto. Other suitable technique may also be applied for the formation of the conductive vias 26.

Still referring to FIG. 1E, in some embodiments, the conductive vias 26 are disposed on and electrically connected to the TSVs 19, and cover a portion of the top surface of the isolation layer 25. In some embodiments, the conductive vias 26 may be in contact with the top surfaces of the dielectric liners DL. In alternative embodiments, as shown in the enlarged view, the conductive vias 26 may be separated from the dielectric liners DL by the isolation layer 25 therebetween.

As shown in FIG. 1E, the size (e.g., width, area, diameter, etc.) of the conductive via 26 is larger than the size of the corresponding TSV 19. For example, the width W2 of the conductive via 26 is larger than the width W1 of the TSV 19. The top surface area of the conductive 26 is also larger than the top surface area of the TSV 19. In some embodiments, the ratio of the width W2 to the width W1 is larger than 1, and may range from 1 to 200 (excluding 1), for example. In some embodiments, the width W2 of the conductive via 26 may range from 30 µm to 100 µm, the width W1 of the TSV 19 may range from 0.5 µm to 30 µm, for example. The conductive via 26 laterally extends beyond the sidewalls of the corresponding TSV 19 and cover a portion of the top surface the isolation layer and/or the top surface of the dielectric liner DL laterally adjacent to the corresponding TSV 19. In some embodiments, when viewed from a top view, the conductive via 26 and the TSV 19 may be circular shaped, or the like, and the widths of the conductive via 26 and the TSV 19 refers to the diameters thereof.

Figure 1F:
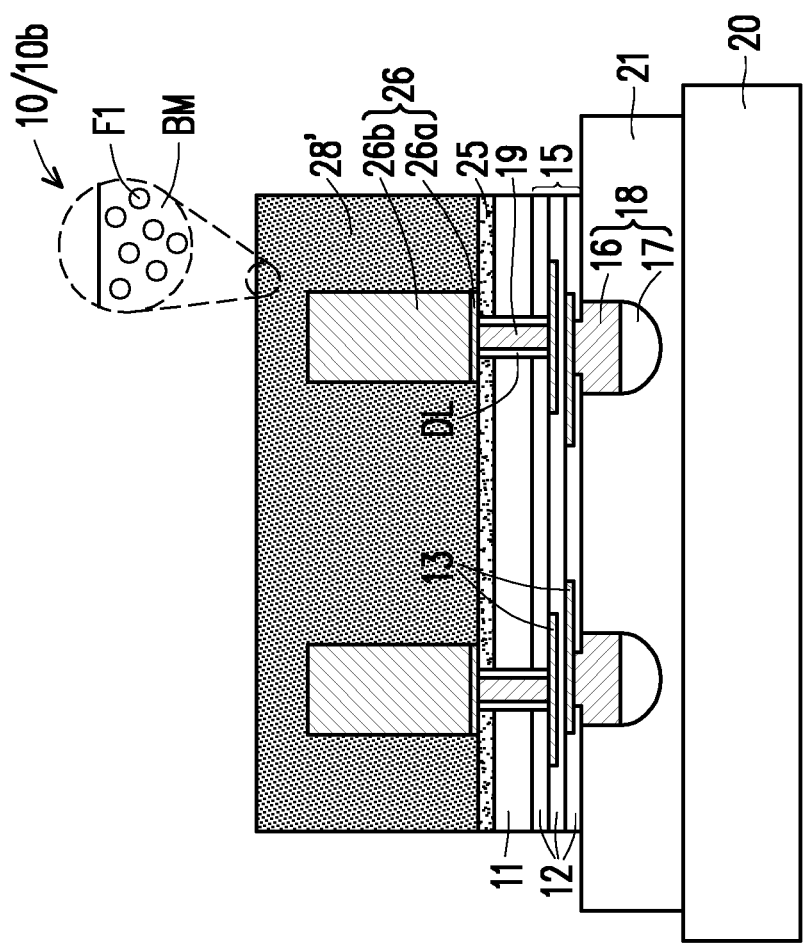

Referring to FIG. 1F, an encapsulant material layer 28' is formed on the isolation layer 25 to encapsulate the conductive vias 26. In some embodiments, the encapsulant material layer 28' is formed to have a top surface higher than the top surfaces of the conductive vias 26, so as to encapsulate sidewalls and top surfaces of the conductive vias 26. In some embodiments, the encapsulant material layer 28' may include a molding compound, a molding underfill, a resin such as epoxy, a combination thereof, or the like. In some other embodiments, the encapsulant material layer 28' includes a photo-sensitive material such as polybenzoxazole (PBO), polyimide (PI), benzocyclobutene (BCB), a combination thereof, or the like. In alternative embodiments, the encapsulant material layer 28' includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant material layer 28' includes a composite material including a base material BM (such as polymer) and a plurality of fillers F1 distributed in the base material BM. The fillers F1 may include a single element, a compound such as nitride, oxide, or a combination thereof. The fillers F1 may include silicon oxide, aluminum oxide, boron nitride, alumina, silica, or the like, or combinations thereof, for example. In some embodiments, the fillers may be spherical fillers, but the disclosure is not limited thereto. The cross-section shape of the filler may be circle, oval, or any other suitable shape. In some embodiments, the encapsulant material layer 28' is formed by a suitable fabrication technique such as molding, spin-coating, lamination, deposition, or similar processes. In the embodiments, since the encapsulant layer 28' is insulating material, the conductive via 26 is in physical contact with the encapsulant layer 28', and there may be free of dielectric liner formed therebetween.

Figure 1G:
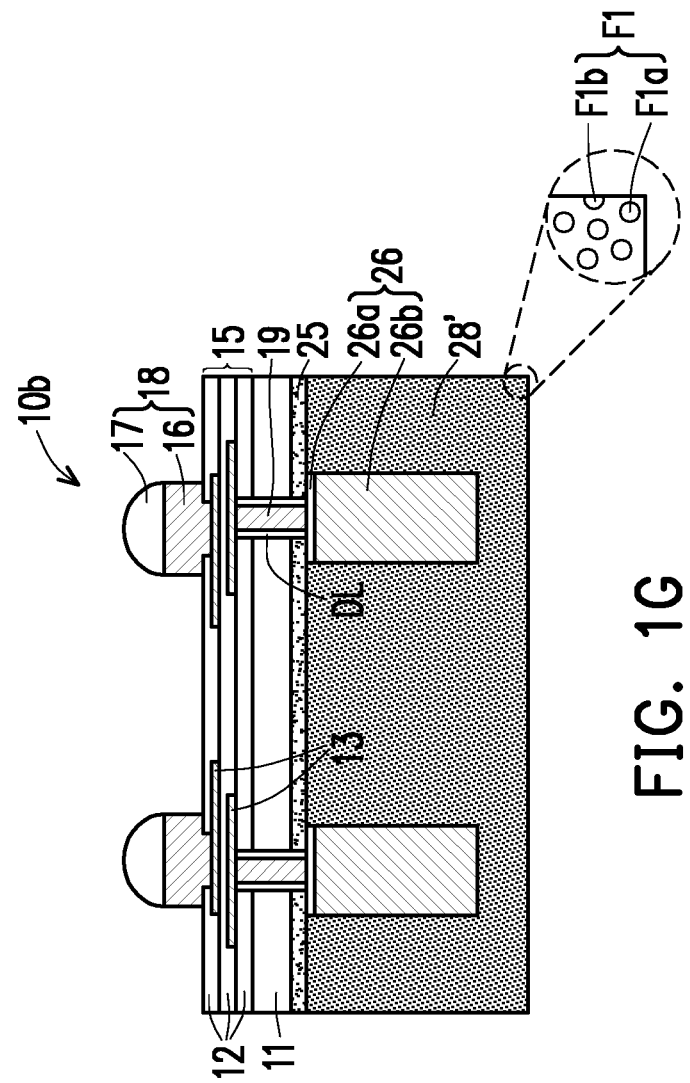

As such, the wafer 10 including a plurality of dies 10b is formed over the carrier 20. Referring to FIG. 1F and FIG. 1G, the tape 21 may be de-bonded from the wafer 10, and the carrier 20 is then released from the wafer 10 including the dies 10b.

Thereafter, a singulation process may be performed on the wafer 10 along scribe lines/regions (not shown) to singulate the dies 10b formed in the die regions of the wafer 10. The singulation process may include a mechanical saw process, laser dicing process, or the like, or combinations thereof. In some embodiments, during the singulation process, some of the fillers F1 may be across the die region and the adjacent scribe region, and therefore, some of the fillers F1 may be cut through and partially removed by the singulation process. As such, some of the fillers F1 may be partially remained in the singulated die 10b. As shown in the enlarged view of FIG. 1G, in some embodiments, after the singulation process, the encapsulant material layer 28' includes fillers F1a and F1b. The fillers F1a are spherical fillers having rounded or curved surface. The filler(s) F1b are partially removed by the singulation process, and a portion of the surface of the filler F1b is rounded or curved, while the other portion of the surface (e.g., side surface) of the filler F1b may be substantially flat or planar and exposed at the sidewall of the die 10b. However, the disclosure is not limited thereto. In some other embodiments, no filler is cut by the singulation process.

Referring to FIG. 1G, in some embodiments, the die 10b includes the substrate 11, the interconnection structure 15 and the connectors 18 disposed on the front side/surface of the substrate 11, the TSVs 19 embedded in the substrate 11, and a conductive via 26 and an encapsulant material layer 28' disposed on the back side/surface of the substrate 11. The isolation layer 25 is disposed between the substrate 11 and the encapsulant material layer 28' and between the substrate 11 and the conductive via 26. The die 10b may also be referred to as a bridge die, and may be used for the subsequent packaging processes.

In some embodiments, the substrate 11, the isolation layer 25 and the encapsulant material layer 28' constitute a substrate structure SS of the die 10b, while the through substrate via 19 and the conductive via 26 constitute a conductive via structure CVS embedded in the substrate structure SS. In other words, the substrate structure SS include a first substrate portion including the substrate 11, a second substrate portion including the encapsulant material layer 28', and an isolation layer 25 disposed between the first substrate portion and the second substrate portion. In some embodiments, the isolation layer 25 may also be referred to as a part of the first substrate portion or the second substrate portion of the substrate structure SS. In some embodiments, the sidewalls of the encapsulant material layer 28', the sidewalls of the isolation layer 25, the sidewalls of the substrate 11 and the sidewalls of the interconnection structure 15 are substantially aligned with each other.

The conductive via structure CVS includes a first via portion (i.e., the through substrate via 19) embedded in the first substrate portion and the isolation layer of the substrate structure SS and a second via portion (i.e., the conductive via 26) embedded in the second substrate portion (i.e., the encapsulant material layer 28') of the substrate structure SS. The second via portion has a larger size than that the first via portion. Further, a dielectric liner DL is disposed between the first via portion (i.e., the through substrate via 19) of the conductive via structure CVS and the first substrate portion (i.e., the substrate 11) of the substrate structure SS, while there may be free of dielectric liner between the second via portion (i.e., the conductive via 26) of the conductive via structure CVS and the second substrate portion (i.e., the encapsulant material layer 28') of the substrate structure SS.

FIG. 2A to FIG. 2G are cross-sectional views illustrating a method of forming a package structure according to some embodiments of the disclosure.

Figure 2A:
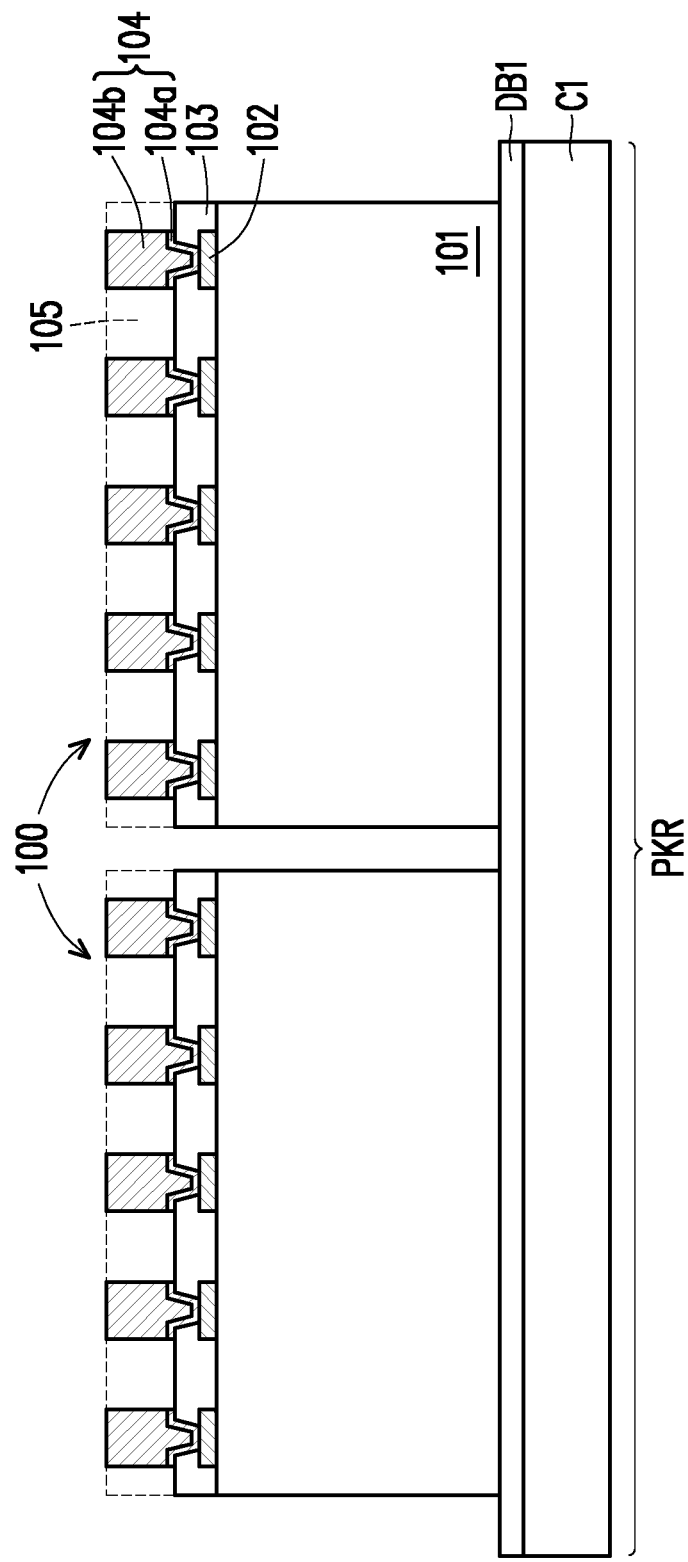
FIG. 2A to FIG. 2G are cross-sectional views illustrating a method of forming a package structure according to some embodiments of the disclosure.

Referring to FIG. 2A, a carrier C1 is provided, the carrier C1 may be a glass carrier, a ceramic carrier, or the like. A de-bonding layer DB1 is formed on the carrier C1 by, for example, a spin coating method. In some embodiments, the de-bonding layer DB1 may be formed of an adhesive such as an Ultra-Violet (UV) glue, a Light-to-Heat Conversion (LTHC) glue, or the like, or other types of adhesives. In some embodiments, the de-bonding layer DB1 is decomposable under the heat of light to thereby release the carrier C1 from the overlying structures that will be formed in subsequent steps. The carrier C1 may include a plurality of package regions PKR on which a plurality of package structures are to be formed. For the sake of brevity, one of the plurality of package regions PKR is illustrated in the figures.

In some embodiments, a plurality of dies 100 are mounted over the carrier C1 by pick and place processes, for example. In some embodiments, the dies 100 are attached to the de-bonding layer DB1 through adhesive layers (not shown), such as die attach film (DAF), silver paste, or the like. The dies 100 are mounted within the package regions PKR, and may be arranged as an array, for example. In some embodiments, two dies 100 are mounted as side by side in each package region PKR, but the disclosure is not limited thereto. In the embodiments of the disclosure, at least two dies (e.g., more than two dies) may be mounted in each package region PKR. The number of the dies mounted in different package regions PKR may be the same or different.

Still referring to FIG. 2A, the dies 100 may be singulated from one or more semiconductor wafers, for example. In some embodiments, the dies 100 are device dies. For example, the dies 100 may respectively be an application-specific integrated circuit (ASIC) chip, an System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application processor (AP) die, or a memory chip such as a Dynamic Random Access Memory (DRAM) die, a Static Random Access Memory (SRAM) die, or a high bandwidth memory (HBM) chip, or the like, other suitable types of die, for example. In some embodiments, the plurality of dies 100 may be the same types of dies or different types of dies. In an embodiment, one of the dies 100 is SoC, while the other one of the dies 100 is HBM chip, but the disclosure is not limited thereto.

In some embodiments, the die 100 includes a substrate 101, a plurality of pads 102, a passivation layer 103, and a plurality of connectors 104. In some embodiments, the substrate 101 is made of silicon or other semiconductor materials. Alternatively or additionally, the substrate 101 includes other elementary semiconductor materials such as germanium, gallium arsenic, or other suitable semiconductor materials. In some embodiments, the substrate 101 may further include other features such as various doped regions, a buried layer, and/or an epitaxy layer. Moreover, in some embodiments, the substrate 101 is made of an alloy semiconductor such as silicon germanium, silicon germanium carbide, gallium arsenic phosphide, or gallium indium phosphide. Furthermore, the substrate 101 may be a semiconductor on insulator such as silicon on insulator (SOI) or silicon on sapphire.

In some embodiments, a plurality of devices (not shown) are formed in and/or on the substrate 101. The devices may be active devices, passive devices, or combinations thereof. For example, the devices may include transistors, capacitors, resistors, diodes, photodiodes, fuse devices, or the like, or combinations thereof. In some embodiments, an interconnection structure (not shown) including a dielectric structure and interconnect wirings are formed over the devices on the substrate 101. The interconnection wirings are embedded in the dielectric structure and electrically connected to the devices to form a functional circuit. In some embodiments, the dielectric structure includes inter-layer dielectric layers (ILDs) and inter-metal dielectric layers (IMDs). The interconnect wirings may include multi-layers of conductive lines, conductive vias, and conductive contacts. The conductive contacts may be formed in the ILDs to electrically connect the conductive lines to the devices; the conductive vias may be formed in the IMDs to electrically connect the conductive lines in different tiers. The interconnect wirings may include metal, metal alloy or a combination thereof, such as tungsten (W), copper (Cu), copper alloys, aluminum (Al), aluminum alloys, or combinations thereof.

The pads 102 may be or electrically connected to a top conductive feature of the interconnection structure, and further electrically connected to the devices formed on the substrate 101 through the interconnection structure. The material of the pads 102 may include metal or metal alloy, such as aluminum, copper, nickel, or alloys thereof.

The passivation layer 103 is formed over the substrate 101 and covers portions of the pads 102. The other portions of the pads 102 are exposed by the passivation layer 103 for external connection. The connectors 104 are formed on and electrically connected to the pads 102 not covered by the passivation layer 103. The passivation layer 103 may include an insulating material such as silicon oxide, silicon nitride, polymer, or a combination thereof. The polymer may include polybenzoxazole (PBO), polyimide (PI), benzocyclobutene (BCB), the like, or combinations thereof. The connectors 104 may include solder bumps, gold bumps, copper bumps, copper posts, copper pillars, or the like. In some embodiments, the connector 104 includes a seed layer 104a and a conductive post 104b on the seed layer 104a. The seed layer 104a is a metal seed layer such as a copper seed layer. In some embodiments, the seed layer 104a includes a first metal layer such as titanium layer and a second metal layer such as a copper layer disposed on the first metal layer. The conductive post 104b includes copper, for example. It is noted that, for the sake of brevity, the detailed structure (i.e., including the seed layer and the conductive post) of the connector 104 is not specifically shown in the following figures FIG. 2B to FIG. 2G.

In some embodiments, portions of the connectors 104 protrude from the top surface of the passivation layer 103 and are exposed. In some alternative embodiments, another passivation layer 105 may further be disposed on the passivation layer 103 to at least cover sidewalls of the connectors 104. The passivation layer 105 is shown as dotted line in FIG. 2A, which represent the passivation layer 105 is optionally formed. In the present embodiments, the passivation layer 105 may be omitted.

Figure 2B:
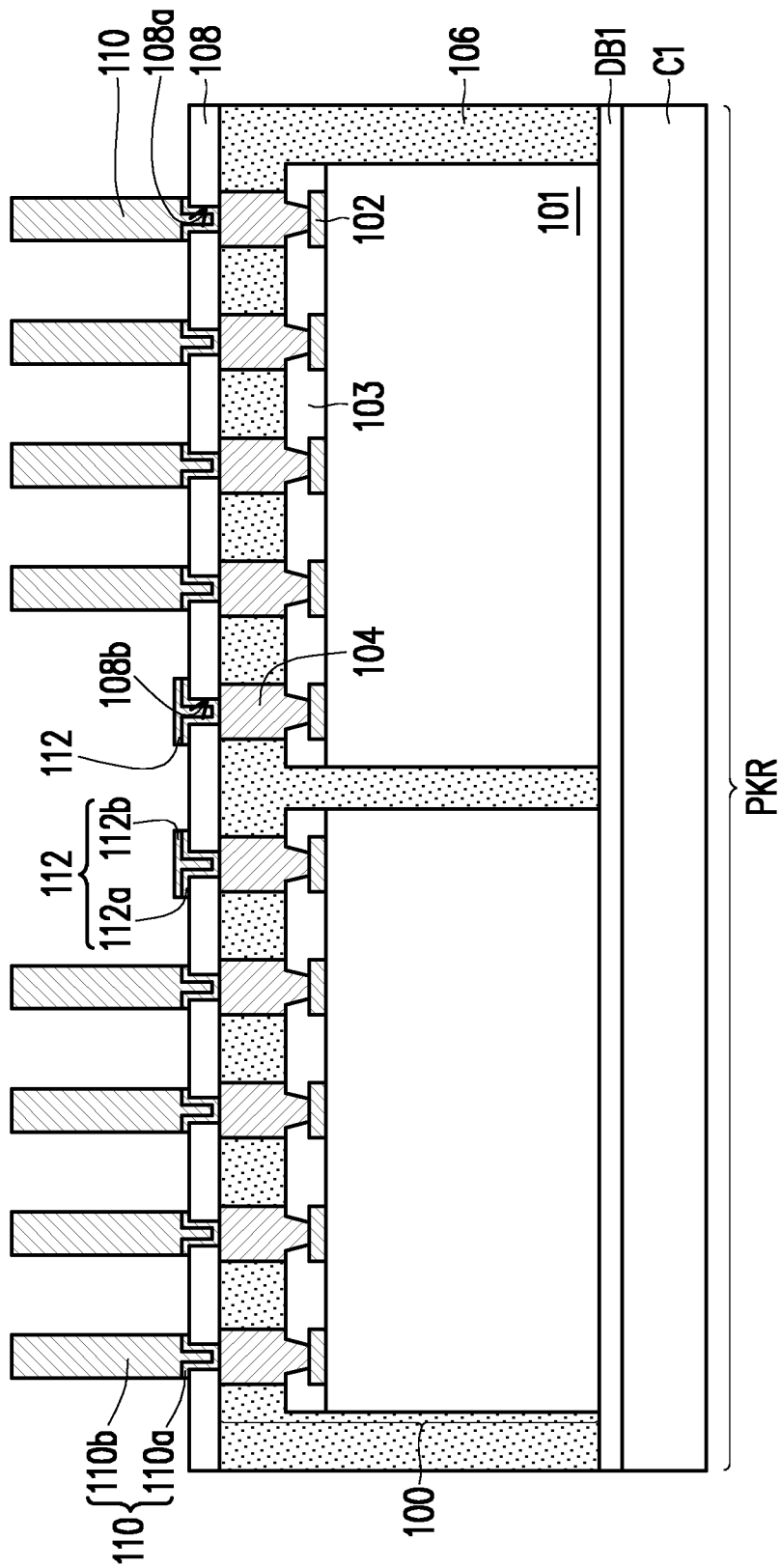

Referring to FIG. 2B, an encapsulant 106 is formed over the carrier C1 to encapsulate the dies 100. The encapsulant 106 may include a material similar to, the same as or different from the material of the encapsulant material layer 28' (FIG. 1F). In some embodiments, the encapsulant 106 may include a molding compound, a molding underfill, a resin such as epoxy, a combination thereof, or the like. In some other embodiments, the encapsulant 106 includes a photo-sensitive material such as polybenzoxazole (PBO), polyimide (PI), benzocyclobutene (BCB), a combination thereof, or the like. In alternative embodiments, the encapsulant material layer 28' includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 106 may include a molding compound which is a composite material. For example, the encapsulant may include a base material (such as polymer) and a plurality of fillers distributed in the base material. The fillers may include a single element, a compound such as nitride, oxide, or a combination thereof. The fillers may include silicon oxide, aluminum oxide, boron nitride, alumina, silica, or the like, or combinations thereof, for example. In some embodiments, the fillers may be spherical fillers, but the disclosure is not limited thereto. The cross-section shape of the filler may be circle, oval, or any other suitable shape. In some embodiments, the encapsulant 106 is formed by forming an encapsulant material layer over the carrier C1 to encapsulate top surfaces and sidewalls of the dies 100, through a suitable fabrication technique such as molding, spin-coating, lamination, deposition, or similar processes. Thereafter, a planarization process (e.g., CMP) is performed to remove excess portion of the encapsulant material layer over the top surfaces of the dies 100, such that the top surfaces of the connectors 104 of the dies 100 are exposed. In some embodiments, the top surface of the encapsulant 106 and the top surfaces of the connectors 104 of the dies 100 are substantially coplanar or level with each other. In the present embodiments, the encapsulant 106 encapsulates sidewalls of the dies 100, the top surfaces of the passivation layers 103 and sidewalls of the connectors 104 of the dies 100.

Still referring to FIG. 2B, a dielectric layer 108 is formed on the dies 100 and the encapsulant 106. The dielectric layer 108 may be a single layer or a multi-layer structure. The material of the dielectric layer 108 may include an inorganic dielectric material, an organic dielectric material, or a combination thereof. The inorganic dielectric material may include, for example, silicon oxide, silicon nitride, silicon oxynitride, or combinations thereof. The organic dielectric material includes a polymer. The polymer may include a photosensitive material, a non-photosensitive material, or a combination thereof. In some embodiments, the photosensitive material includes photosensitive polybenzoxazole (PBO), polyimide (PI), benzocyclobutene (BCB), a combination thereof, and/or the like. The non-photosensitive material includes Ajinomoto buildup film (ABF). The dielectric layer 108 may be formed by chemical vapor deposition, spin coating, lamination, or the like, or a combination thereof.

Still referring to FIG. 2B, in some embodiments, a plurality of conductive vias 110 and a plurality of conductive pads 112 are formed on the dielectric layer 108 and penetrate through the dielectric layer 108 to electrically connect to the connectors 104 of the dies 100. The conductive vias 110 may each include a seed layer 110a and a conductive post 110b on the seed layer 110a. The conductive pads 112 may each include a seed layer 112a and a conductive layer 112b on the seed layer 112a. The seed layer 110a/112a may be a metal seed layer such as a metal seed layer. In some embodiments, the seed layer 110a/112a includes a first metal layer such as a titanium layer and a second layer such as a copper layer on the titanium layer. The conductive post 110*b* and the conductive layer 112*b* may include copper.

In some embodiments, the formation of the conductive vias 110 and conductive pads 112 may include the following processes. After the dielectric layer 108 is formed, a patterning process is performed on the dielectric layer 108 to form a plurality of openings 108*a* and 108*b* therein. The openings 108*a* and 108*b* expose portions of the top surfaces of the connectors 104. The openings 108*b* are adjacent to each other and between the openings 108*a*. The openings 108*a* and 108*b* may have the same or different sizes. The patterning process may include photolithograph and etching processes, laser drilling process, or the like, or combination thereof. The conductive vias 110 and conductive pads 112 are formed on the dielectric layer 108 and filled into the openings 108*a* and 108*b* to be in physical and electrical contact with the connectors 104, respectively. The conductive vias and the conductive pads may be formed simultaneously or separately.

For example, after the openings 108*a* and 108*b* are formed in the dielectric layer 108, a seed material layer is formed on the dielectric layer 108 and lining the openings 108*a* and 108*b*. Thereafter, a first patterned mask layer is formed on the seed material layer, the first patterned mask layer has a plurality of openings exposing a portion of the seed material layer at the intended locations for the conductive vias 110. The opening of the first patterned mask layer is disposed directly over the opening 108*a* of the dielectric layer 108 and may have a size (e.g., width) larger than that of the opening 108*a*. In some embodiments, the first patterned mask fills into the openings 108*b* to cover the seed material layer in the opening 108*b*. In other words, the openings 108*b* with portions of the seed material layer therein are masked by the first patterned mask layer. Thereafter, a plurality of conductive posts 110*b* for the conductive vias 110 are formed on the seed material layer within the openings of the first patterned mask layer and the openings 108*a*, through a plating process such as electroplating. The first patterned mask layer is then removed by an ashing or stripping process, for example.

Then, a second patterned mask layer is formed on seed material layer and covers the conductive vias 110. The second patterned mask layer has a plurality of openings exposing another portion of the seed material layer at the intended locations for the conductive pads 112. The openings of the second patterned mask layer may be disposed directly over the openings 108*b* of the dielectric layer 108 and may each have a size (e.g., width) larger than that of the corresponding opening 108*b*. Thereafter, a plurality of conductive layers 112*b* for the conductive pads 112 are formed on the seed material layer within the openings of the second patterned mask layer and the openings 108*b*, through a plating process such as electroplating. The second patterned mask layer is then removed by an ashing or stripping process, for example. Thereafter, portions of the seed material layer not covered by the conductive posts 110*b* and the conductive layers 112*b* are removed by an etching process using the conductive posts 110*b* and the conductive layers 112*b* as etching mask, remaining seed layers 110*a* and 112*a* underlying the conductive posts 110*b* and the conductive layers 112*b*. As such, the conductive posts 110*b* and the seed layers 110*a* underlying thereof constitute the conductive vias 110, while the conductive layers 112*b* and the seed layers 112*a* underlying thereof constitute the conductive pads 112.

As shown in FIG. 2B, in some embodiments, the conductive pads 112 are adjacent to each other and between the conductive vias 110. One of the conductive pads 112 may be electrically connected to the connector 104 which is located at or near an edge of one of the dies 100, while the other one of the conductive pads 112 may be electrically connected to the connector 104 which is located at or near an edge of the other one of the dies 100. The top surfaces of the conductive vias 110 are higher than the top surfaces of the conductive pads 112. In other words, the height of the conductive via 110 is larger than the height of the conductive pad 112.

In some embodiments, the conductive via 110 includes a via portion embedded in the dielectric layer 108 and a post portion disposed on the via portion and protruding from the top surface of the dielectric layer 108. The via portion penetrates through the dielectric layer 108 and landing on the connector 104 of the dies 100, so as to provide the electrical connection between the connector 104 and the post portion. In some embodiments, the post portion laterally extending beyond sidewalls of the via portion, and thus have a size (e.g., width) larger than that of the via portion. In some embodiments, the via portion and the post portion of the conductive via 110 are integrally formed, and there is free of interface therebetween. However, the disclosure is not limited thereto. In some other embodiments, the via portion and the post portion of the conductive via 110 may be separately formed, and thus have interface formed therebetween.

The conductive pad 112 includes a via portion embedded in the dielectric layer 108 and a pad portion disposed on the via portion and protruding from the top surface of the dielectric layer 108. The via portion is disposed between the pad portion and the connector 104 of the die 100 to provide the electrical connection therebetween. The pad portion laterally extends beyond sidewalls of the via portion and has a size (e.g., width) larger than that of the via portion. In the present embodiments, the via portion and the pad portion of the conductive pad 112 are integrally formed, and there is free of interface therebetween, but the disclosure is not limited thereto. In some other embodiments, the via portion and the pad portion of the conductive pad 112 may be separately formed, and thus have interface formed therebetween. It is noted that, for the sake of brevity, the detailed structure (including seed layer and conductive post/layer) of the conductive vias 110 and conductive pads 112 are not specifically shown in FIG. 2C and the following figures.

Figure 2C:
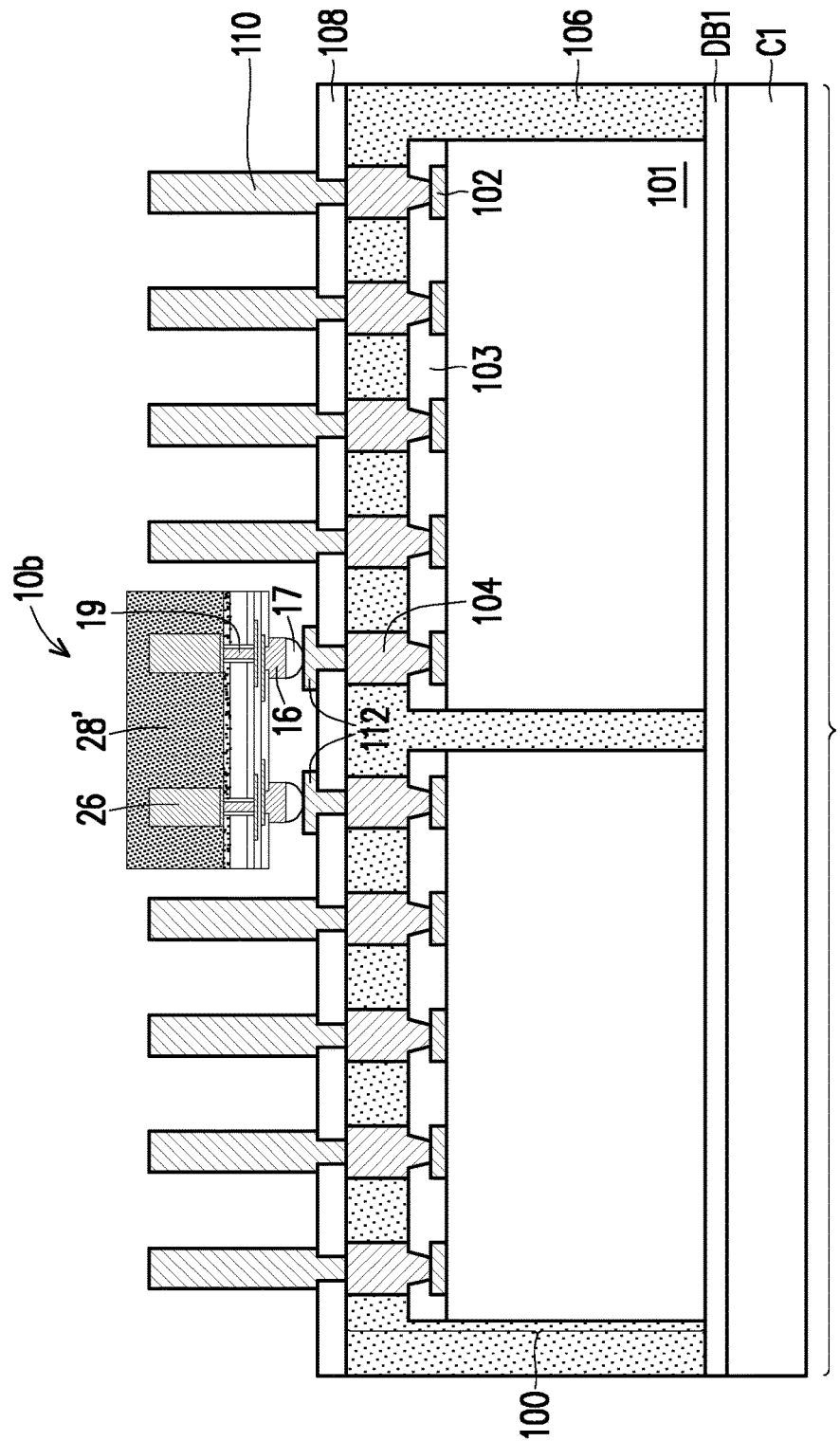

Referring to FIG. 2C, in some embodiments, the die 10*b* formed in FIG. 1G is bonded to the conductive pads 112. In some embodiments, the die 10*b* is flipped upside down and electrically bonded to the conductive pads 112 through the connectors 18. In some embodiments in which the connector 18 include the conductive post 16 and the conductive cap 17, the conductive cap 17 is disposed between the conductive post 16 and the conductive pad 112 to provide electrical connection therebetween. The die 10*b* is further electrically connected to the dies 100 through the conductive pads 112. In other words, the front surface of the die 10*b* faces the conductive pad 112 and faces toward the front surfaces of the dies 100, while the back surface of the die 10*c* faces upward. Herein, a "front surface" of a die refers to the surface having or close to the connectors and may also be referred to as an active surface, and "back surface" of the die is the surface opposite to the front surface. In the present embodiments, the back surface of the die 10*b* include a surface of the encapsulant material layer 28'.

In some embodiments, the die 10*b* is laterally between or surrounded by the conductive vias 110, the top surface of the die 10*c* and the top surfaces of the conductive vias 110 may be at the same or different level heights. In some embodiments, the top surface of the die 10*b* is higher than the top surfaces of the conductive vias 110, but the disclosure is not limited thereto. In alternative embodiments, the top surface of the die 10c may be substantially coplanar with or lower than the top surfaces of the conductive vias 110.

Figure 2D:
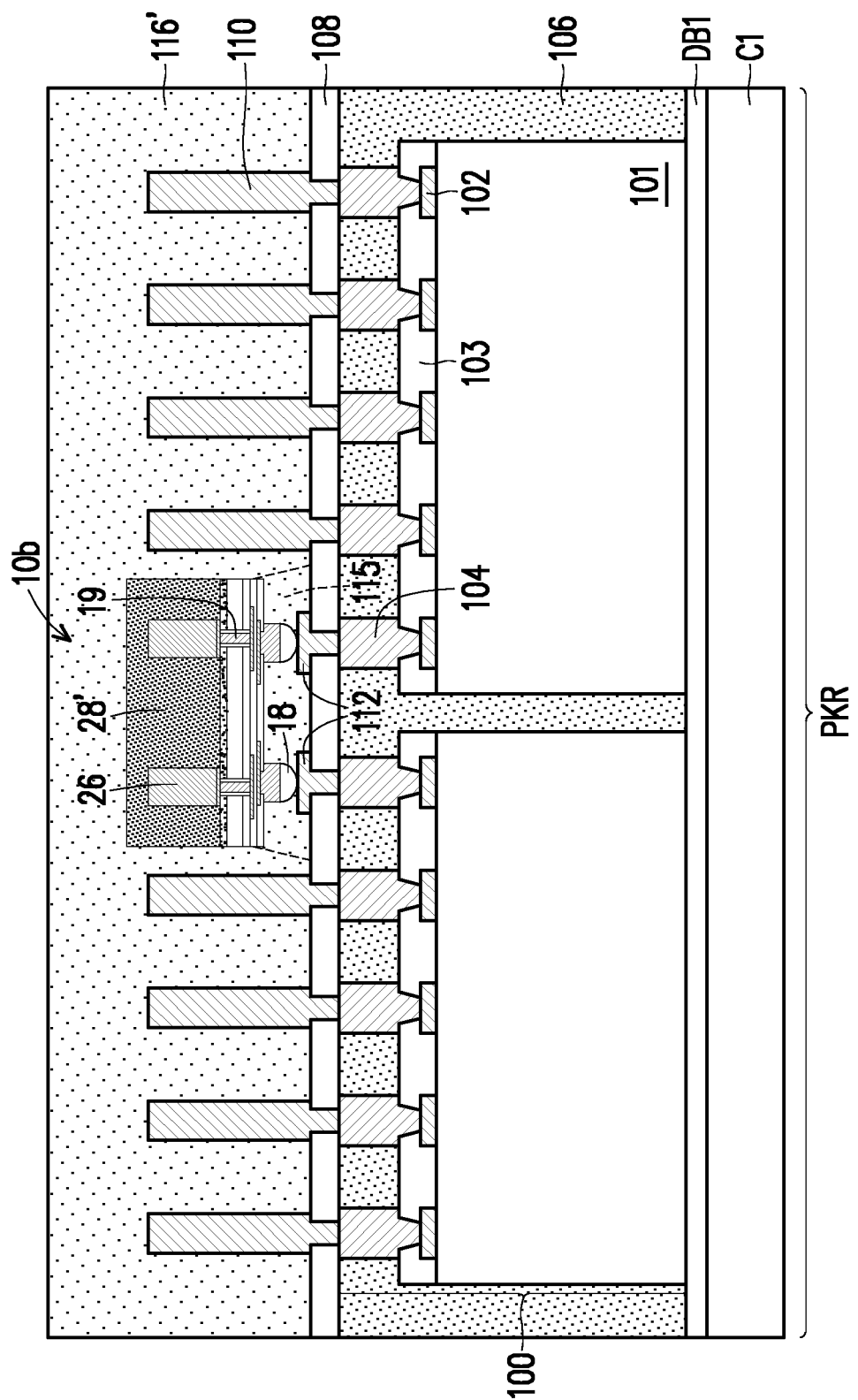

Referring to FIG. 2D, in some embodiments, an encapsulant material layer 116' is formed on the dielectric layer 108 to encapsulate the conductive vias 110 and the die 10b. The encapsulant 116' includes a material similar to, the same as or different from that the materials of the encapsulant 106 and/or the encapsulant material layer 28'. For example, the encapsulant material layer 116' may include a molding compound, a molding underfill, a resin such as epoxy, a combination thereof, or the like. In some other embodiments, the encapsulant material layer 116' includes a photo-sensitive material such as polybenzoxazole (PBO), polyimide (PI), benzocyclobutene (BCB), a combination thereof, or the like. In alternative embodiments, the encapsulant material layer 116 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant material layer 116' may include a molding compound which is a composite material. For example, the encapsulant may include a base material (such as polymer) and a plurality of fillers distributed in the base material. The fillers may include a single element, a compound such as nitride, oxide, or a combination thereof. The fillers may include silicon oxide, aluminum oxide, boron nitride, alumina, silica, or the like, or combinations thereof, for example. In some embodiments, the fillers may be spherical fillers, but the disclosure is not limited thereto. The cross-section shape of the filler may be circle, oval, or any other suitable shape.

In some embodiments, the encapsulant material layer 116' is formed to have a top surface higher than top surfaces of the conductive vias 110 and the die 10a, so as to encapsulant sidewalls and top surfaces of the conductive vias 110 and the die 10a. However, the disclosure is not limited thereto. In some alternative embodiments, the encapsulant material layer 116' may be formed to have a top surface at least higher than the top surfaces of the conductive vias 110 and may be lower than or substantially coplanar with the top surface of the encapsulant material layer 28' of the die 10a.

In some embodiments, an underfill layer 115 (shown as the dotted line) may be optionally formed to fill the space between the bridge die 10b and the dielectric layer 108, before forming the encapsulant material layer 116'. The underfill layer 115 may cover and surround the connectors 18 of the die 10b and the pad portions of the conductive pads 112. The underfill layer 115 is optionally formed and may be omitted in some embodiments. If the underfill layer 115 is omitted, the encapsulant material layer 116' would be formed to fill the space between the bridge die 10b and the dielectric layer 28 and encapsulate the connectors 18 of the bridge die 10b and the pad portions of the conductive pads 112.

Figure 2E:
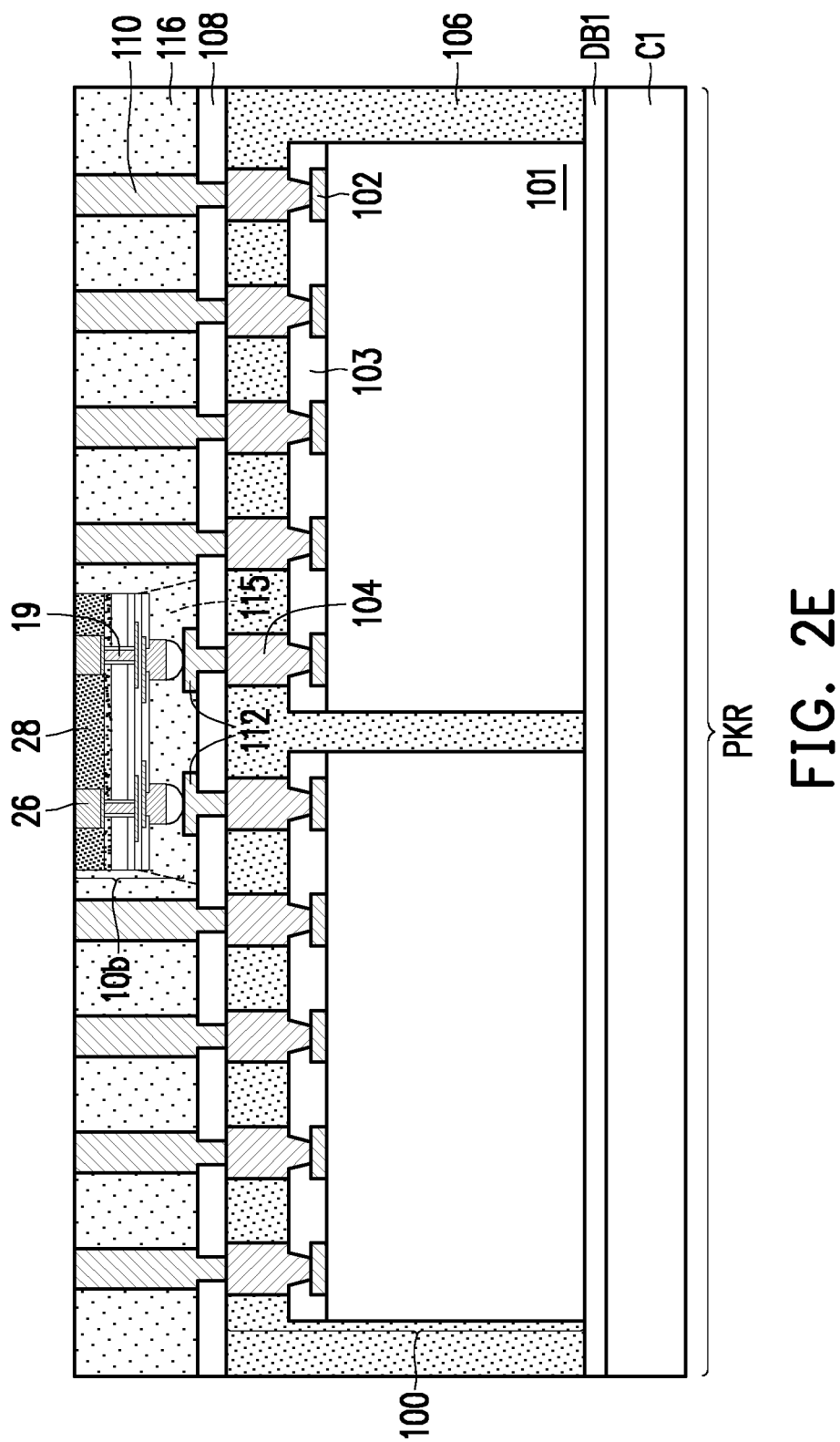

Referring to FIG. 2D and FIG. 2E, thereafter, a planarization process is performed to remove excess portions of the encapsulant material layer 116' and excess portions of the encapsulant material layer 28', such that the conductive vias 110 and the conductive vias 26 of the die 10c are exposed, and an encapsulant 116 and an encapsulant layer 28 are thus formed. In some embodiments, at least portions of the encapsulant material layer 116' over the top surfaces of the conductive vias 110 and at least portions of the encapsulant material layer 28' over the top surfaces of the conductive vias 26 are removed during the planarization process. In some alternative embodiments, the conductive vias 110 and/or the conductive vias 26 and the encapsulant material laterally there-aside may also be removed during the planarization process. The planarization process may include a grinding process, a CMP process, or the like, or combinations thereof, for example.

Referring to FIG. 2E, in some embodiments, after the planarization process is performed, the top surface of the encapsulant 116, the top surfaces of conductive vias 110, the top surface of the encapsulant layer 28 and the top surfaces of the conductive vias 26 of the die 10b (i.e., the back surface of the die 10b) are substantially level or coplanar with each other. The conductive vias 110 and the conductive vias 26 are exposed by the encapsulants 116 and 28, respectively. The encapsulant 116 laterally encapsulates sidewalls of the conductive vias 110, sidewalls of the die 10b and/or sidewalls of the underfill layer 115. The encapsulant layer 28 laterally encapsulates sidewalls of the conductive vias 26 of the die 10b. The conductive vias 110 penetrates through the encapsulant 116 and may also be referred to as through integrated fan-out via (TIVs). The conductive vias 26 penetrates through the encapsulant layer 28. In some embodiments in which the encapsulant layer 28 includes a molding compound, the conductive vias 26 may also be referred to as through molding via (TMV).

Figure 2F:
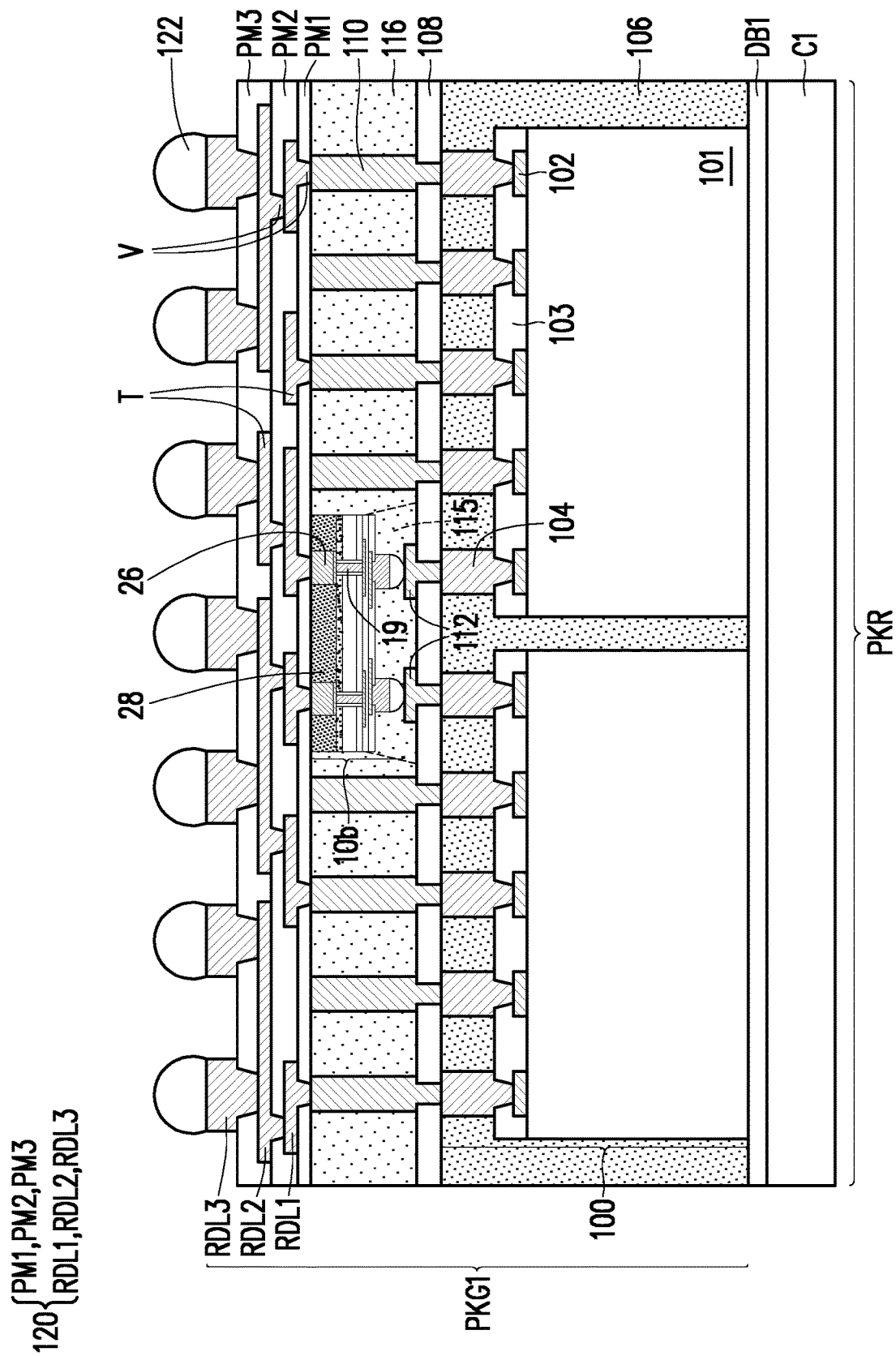

Referring to FIG. 2F, thereafter, a redistribution layer (RDL) structure 120 is formed over the encapsulant 116. In some embodiments, the RDL structure 120 includes a plurality of polymer layers PM1, PM2, PM3 and a plurality of redistribution layers RDL1, RDL2, RDL3 stacked alternately. The number of the polymer layers or the redistribution layers shown in the figures is merely for illustration, and the disclosure is not limited thereto.

The redistribution layer RDL1 penetrates through the polymer layer PM1 to be physically and electrically connected to the conductive vias 26 of the die 10b and the conductive vias 110. The redistribution layer RDL2 penetrates through the polymer layer PM2 to be electrically connected to the redistribution layer RDL1. The redistribution layer RDL3 penetrates through the polymer layer PM3 to be electrically connected to the redistribution layer RDL2.

In some embodiments, the polymer layers PM1, PM2, PM3 respectively includes a photo-sensitive material such as polybenzoxazole (PBO), polyimide (PI), benzocyclobutene (BCB), a combination thereof or the like. The forming methods of the polymer layers PM1, PM2, PM3 include suitable fabrication techniques such as spin coating, chemical vapor deposition (CVD), plasma-enhanced chemical vapor deposition (PECVD), lamination or the like. In some embodiments, the redistribution layers RDL1, RDL2, RDL3 respectively include conductive materials. The conductive material includes metal such as copper, nickel, titanium, a combination thereof or the like, and may be formed by PVD, plating such as an electroplating process, or combinations thereof. In some embodiments, the redistribution layers RDL1, RDL2, RDL3 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metallic materials.

In some embodiments, the redistribution layers RDL1, and RDL2 respectively includes a plurality of vias V and a plurality of traces T connected to each other. The vias V vertically penetrate through the polymer layers PM1, PM2 to connect the traces T of the redistribution layers RDL1 to the underlying conductive vias 110 and 26, and connect the traces T of the redistribution layers RDL1, RDL2 to each other. The traces T are horizontally extending on the top surfaces of the polymer layers PM1, PM2, respectively.

In some embodiments, the redistribution layer RDL3 is the topmost redistribution layer of the RDL structure 120. The redistribution layer RDL3 may include conductive pillars. For example, the redistribution layer RDL3 may include via portions embedded in the polymer layer PM3 and landing on the redistribution layer RDL2; and protruding portions disposed on the via portions and protruding from the top surface of the polymer layer PM3. However, the disclosure is not limited thereto. In some embodiments, the redistribution layer RDL3 may be or include an under-ball metallurgy (UBM) layer for ball mounting.

Still referring to FIG. 2F, thereafter, a plurality of connectors 122 are formed over and electrically connected to the redistribution layer RDL3 of the RDL structure 120. In some embodiments, the connectors 122 are also referred to as conductive terminals. In some embodiments, the connectors 122 may be ball grid array (BGA) connectors, solder balls, controlled collapse chip connection (C4) bumps, or a combination thereof. In some embodiments, the material of the connector 122 includes copper, aluminum, lead-free alloys (e.g., gold, tin, silver, aluminum, or copper alloys) or lead alloys (e.g., lead-tin alloys). The connector 122 may be formed by a suitable process such as evaporation, plating, ball dropping, screen printing and reflow process, a ball mounting process or a C4 process.

As such, a plurality of package structures PKG1 are thus formed over the carrier C1 within the plurality of package regions PKR.

Figure 2G:
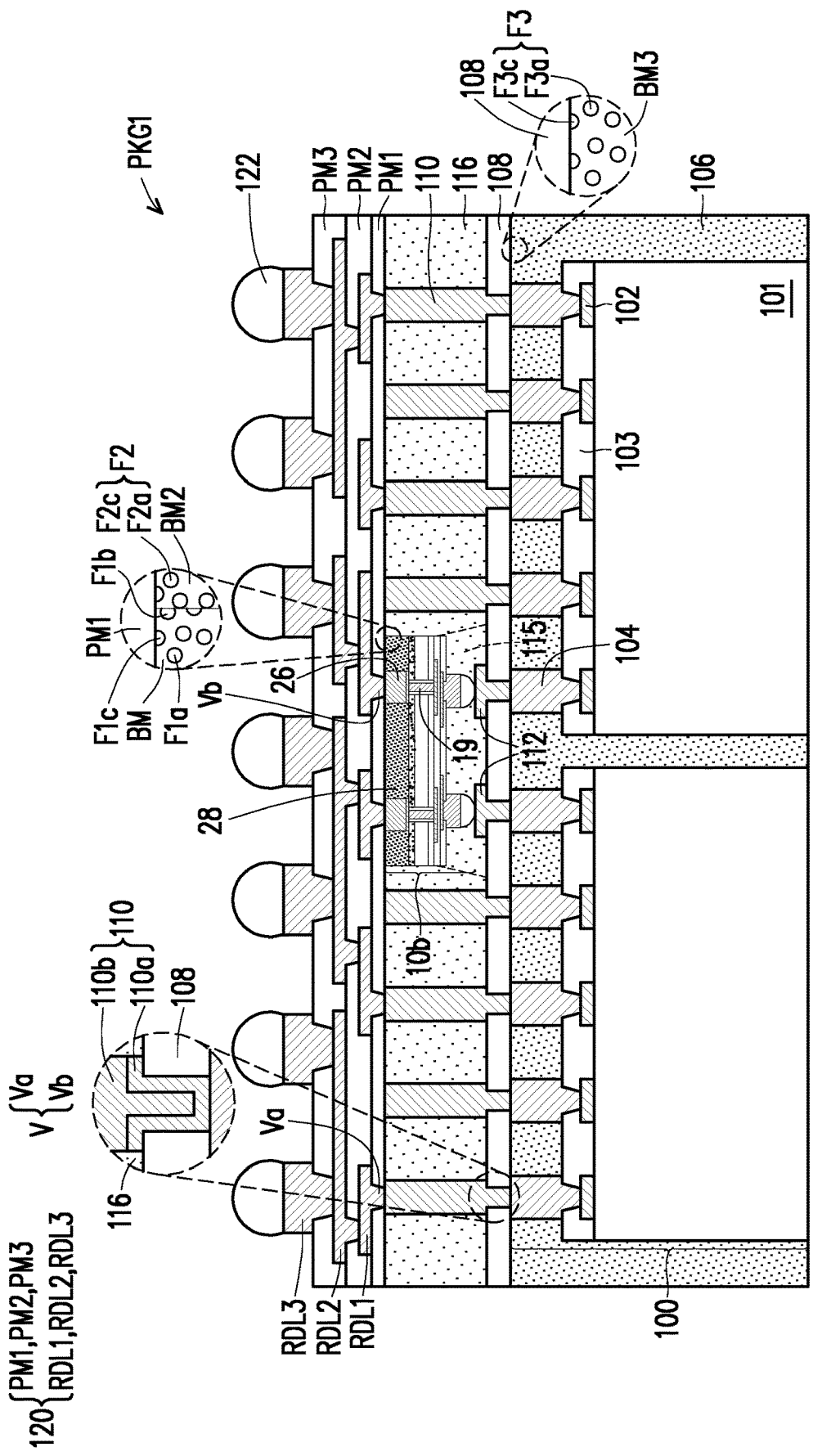

Referring to FIG. 2F and FIG. 2G, in some embodiments, the de-bonding layer DB1 is decomposed under the heat of light, and the carrier C1 is then released from the overlying structure. In some embodiments, thereafter, a singulation process may be performed to singulate the package structures PKG1.

Referring to FIG. 2G, in some embodiments, the package structure PKG1 includes the dies 100, the encapsulant 106, the dielectric layer 108, the bridge die 10b, the TIVs 110, the encapsulant 116, the RDL structure 120 and the connectors 122. The dies 110 are disposed as side by side and encapsulated by the encapsulant 106. In some embodiments, the bottom surface of the encapsulant 106 is substantially coplanar with the bottom surfaces (i.e. the back surface, or the bottom surface of the substrate 101) of the dies 101. The top surface of the encapsulant 106 may be substantially coplanar with the topmost surface of the die 100 (i.e., the top surfaces of the connectors 104).

The dielectric layer 108 is disposed on and in physical contact with the top surface of the encapsulant 106 and the top surfaces of the connectors 104 of the dies 100. The encapsulant 116 is disposed on the dielectric layer 108 and separated from the encapsulant 106 by the dielectric layer 108 therebetween. The conductive vias 110 penetrate though the encapsulant 116 and the dielectric layer 108 to be electrically and physically connected to the connectors 104 of the dies 100. In some embodiments, the seed layer 110a of the conductive vias 110 is in physical and electrical contact with the connector 104 of the die 100 and the dielectric layer 108, a portion of the seed layer 110a is located on the top surface of the dielectric layer 108 and laterally encapsulated by the encapsulant 116. The bottom surface of the portion of the seed layer 110a is substantially level or coplanar with the bottom surface of the encapsulant 116.

The conductive pads 112 is disposed on and penetrating through the dielectric layer 108 to connect to the connectors 104 of the dies 110. The bridge die 10b is electrically bonded to the conductive pads 112 and further connected to the dies 100 through the conductive pads 112. In the embodiments, the sidewalls of the die 10b including the sidewalls of the encapsulant layer 28, the sidewalls of the isolation layer 25 and the sidewalls of the substrate 11 are in physical contact with and encapsulated by the encapsulant 116.

The RDL structure 120 is disposed on the encapsulant 116 and electrically connected to the die 10b and the conductive vias 110, and further electrically connected to the dies 100 through the conductive vias 110. In some embodiments, the dies 100 are electrically connected to each other through the bridge die 10b, and through the conductive vias 110 and the RDL structure 120.

In some embodiments, some of the vias V (e.g., Va) of the redistribution layer RDL1 land on the conductive vias 110, while some other vias V (e.g., Vb) of the redistribution layer RDL1 land on the conductive vias 26 of the die 10b. The sizes (e.g., width) of the vias Va and Vb may be the same or different.

In the embodiments of the disclosure, since the die 10b includes conductive vias 26 that are formed on the TSVs 19 and have larger sizes than the TSVs 19, the landing window for via Vb landing on the die 10b is increased. In some embodiments, the bottom width (or bottom surface area) of the via Vb may be less than the top width (or top surface area) of the conductive via 26, and may be larger than, substantially equal to or less than the top width of the TSV 19. In some embodiments, the bottom surface of the via Vb is located on and within the top surface of the corresponding conductive via 26. In some embodiments, the entire via Vb or substantially entire via Vb is landing on the corresponding conductive via 26 of the die 10b. The conductive via 26 may laterally extending beyond the sidewalls of the via Vb and physically contact the bottom surface of the polymer layer PM1 of the RDL structure 120.

In the embodiments, the via Vb is electrically connected to the TSV 19 of the die 10b through the conductive via 26 therebetween. In some embodiments, the contact area between the via Vb and the conductive via 26 may be larger than the contact area between the conductive via 26 and the TSV 19.

Still referring to FIG. 2G, in some embodiments, the package structure PKG1 include the encapsulant 106, the encapsulant 116 and the encapsulant layer 28 included in the die 10b. The encapsulant 106 is separated from the encapsulant 116 by the dielectric layer 108 therebetween. In some embodiments, the sidewalls of the encapsulant 106, the dielectric layer 108, the encapsulant 116, and the RDL structure 120 are substantially aligned with each other in a direction perpendicular to the top surfaces of the dies 100 and 10b. The encapsulant layer 28 is laterally encapsulated and surrounded by the encapsulant 116.

The encapsulants 106, 116 and 28 may comprise similar, or the same or different materials. In some embodiments, the encapsulants 106, 116 and 28 are formed of similar material with similar or different properties. For example, the encapsulants 106, 116 and 28 may each include a molding compound which is a composite material including a base material and fillers distributed therein. In some embodiments, the properties (e.g., CTE, Young's modulus, etc.) of the encapsulants 106, 116 and 28 may be tuned to control warpage of the package structure PKG1, for example, through adjusting the materials of the base materials and fillers, filler sizes, filler loadings (i.e., contents) of the molding compound materials for forming the encapsulants 106, 116, 28. Depending on the requirement for warpage control, the properties (e.g., CTE, Young's modulus, etc.) of the encapsulants 106, 116, 28 may be the same or different.

In some embodiments, since the encapsulant 116 and the encapsulant layer 28 include similar materials, the CTE difference between the encapsulant 116 and the encapsulant layer 28 is quite less than the CTE difference between the encapsulant 116 and the semiconductor substrate 11 of the die 10b. In the embodiments of the disclosure, since the semiconductor substrate 11 of the die 10b is thinned down, and the encapsulant layer 28 is formed on the semiconductor substrate 11 (in other words, the semiconductor substrate of the die 10b is partially replaced by the encapsulant layer 28), the CTE mismatch between the die 10b and the encapsulant 116 is reduced, thereby mitigating the warpage issue that may be caused by CTE mismatch.

In some embodiments, as shown in the enlarged view of FIG. 2G, the encapsulant layer 28 includes the base material BM and fillers F1a, F1b, F1c. As described above, the fillers F1b at the sidewall of the encapsulant layer 28 have flat side surface. Further, since the encapsulant layer 28 was subjected to a planarization process (FIG. 2E), the planarization process may partially remove some fillers of the encapsulant material, thereby remaining some partially removed fillers (e.g., F1c) at the top surface of the encapsulant layer 28. As shown in the enlarged view, the fillers F1c of the encapsulant layer 28 may have flat top surface and curved or rounded surface connected to the flat top surface.

The encapsulant 116 includes a base material BM2 and fillers F2. Similarly, some of fillers F2 may be partially removed by the planarization process (FIG. 2E) and thus have flat top surface. The filler F2 includes spherical fillers F2a which is further from the top surface of the encapsulant 116 and fillers F2c that are partially removed during the planarization process. The filler F2c may have a flat top surface and a curved or rounded surface connected to the flat top surface. In some embodiments, the flat top surfaces of the fillers F1c and the flat top surfaces of the fillers F2c may be substantially coplanar with each other, substantially coplanar with the top surface of the base material BM/BM2 and the top surfaces of the conductive vias 26/110, and are covered by and in physical contact with the bottom surface of the polymer layer PM1.

As shown in the enlarged view of FIG. 2G, the flat side surface of the filler F1b is covered by and in physical contact with the encapsulant 116. In other words, the filler of the encapsulant layer 28 contacting the encapsulant 116 may have substantially flat or planar side surface. As a comparison, since no planarization or singulating process is performed on the surface of the encapsulant 116 in contact with the encapsulant layer 28, the fillers F2a of the encapsulant 116 contacting the encapsulant layer 28 may have rounded surface.

Similarly, the encapsulant 106 includes a base material BM3 and fillers F3 distributed therein. Some of the filler F3 (e.g., F3a) have spherical profiles, and some of the filler F3 (e.g., F3c) at the top of the encapsulant 106 may be partially removed by the planarization process (FIG. 2B) and thus have flat top surfaces. In some embodiments, the flat top surface of the filler F3c is substantially coplanar with the top surface of the base material BM3 of the encapsulant 106 and the top surfaces of the connectors 104 of the dies 100, and is covered by and in physical contact with the bottom surface of the dielectric layer 108.

FIG. 3A to FIG. 3H are cross-sectional views illustrating a method of forming a package structure according to alternative embodiments of the disclosure.

Referring to FIG. 3A, a carrier C1 with a de-bonding layer DB1 is provided. In some embodiments, the carrier C1 includes a plurality of package regions PKR within which a plurality of package structures are to be formed. It is noted that, for the sake of brevity, one of the package regions PKR is illustrated.

In some embodiments, a plurality of conductive vias 210 are formed on the carrier C1. The conductive vias 210 may include a material selected from the same candidate materials of the conductive vias 110 described in the above embodiments. In some embodiments, the conductive via 210 includes a seed layer 210a and a conductive post 210b disposed on the seed layer 210a. The seed layer 210a may be a metal seed layer, such as a copper seed layer. The seed layer 210a may include a material the same as and/or a material different from that of the conductive post 210b. For example, the seed layer 210a may include titanium, copper, the like, or a combination thereof. In some embodiments, the seed layer 210a includes a first metal layer such as a titanium layer and a second metal layer such as a copper layer disposed on the first metal layer. The conductive post 210b may include a suitable metal, such as copper. However, the disclosure is not limited thereto, other suitable metallic materials may also be applied for the conductive vias 210. The conductive vias 210 may have substantially straight sidewalls or inclined sidewalls.

The conductive vias 210 may be formed by the following processes: a seed material layer is formed over the carrier C1 by a physical vapor deposition (PVD) process such as sputtering. A patterned mask layer is then formed on the seed material layer, the patterned mask layer has a plurality of openings exposing portions of the seed material layer at the intended locations for the subsequently formed conductive vias 210. Thereafter, the conductive posts 210b are formed on the seed material layer within the openings by a plating process, such as electroplating. Thereafter, the patterned mask layer is stripped by an ashing process, for example. The seed material layer not covered by the conductive posts 210b is removed by an etching process using the conductive posts 210b as the etching mask. As such, the conductive posts 210b and the remained seed layers 210a underlying thereof constitute the conductive vias 210.

Still referring to FIG. 3A, in some embodiments, a die 10c is attached to the de-bonding layer DB1 over the carrier C1 through an adhesive layer 201 such as a die attach film (DAF), silver paste, or the like. In some embodiments, the die 10c is attached to the carrier C1 with the back surface (i.e. the bottom surface of the encapsulant material layer 28') facing the carrier C1 and the front surface of the die 10c faces up.

The die 10c is similar to the die 10b described in FIG. 1G, and may be formed by processes similar to those of the die 10b as described in FIG. 1A to FIG. 1G, except that the connector 18 of the die 10c is free of the conductive cap and further includes a passivation layer 30. As shown in FIG. 3A, in some embodiments, the conductive posts 16 serve as the connectors 18 of the die 10c, without conductive caps covering thereon. The passivation layer 30 is further formed over the interconnection structure 15 and covering the connectors 18. In some embodiments, the passivation layer 30 may be formed to have a top surface higher than the top surfaces of the connectors 18, such that the sidewalls and top surfaces of the connectors 18 are covered by the passivation layer 30 currently. In some alternative embodiments, the passivation layer 30 may have a top surface substantially level or coplanar with the top surfaces of the connectors 18.

In some embodiments, the die 10c may be laterally between and surrounded by the conductive vias 210. That is, the conductive vias 210 are laterally aside or around the die 10c. The top surfaces of the die 10c and the conductive vias 210 may be at the same or different level heights.

Figure 3B:
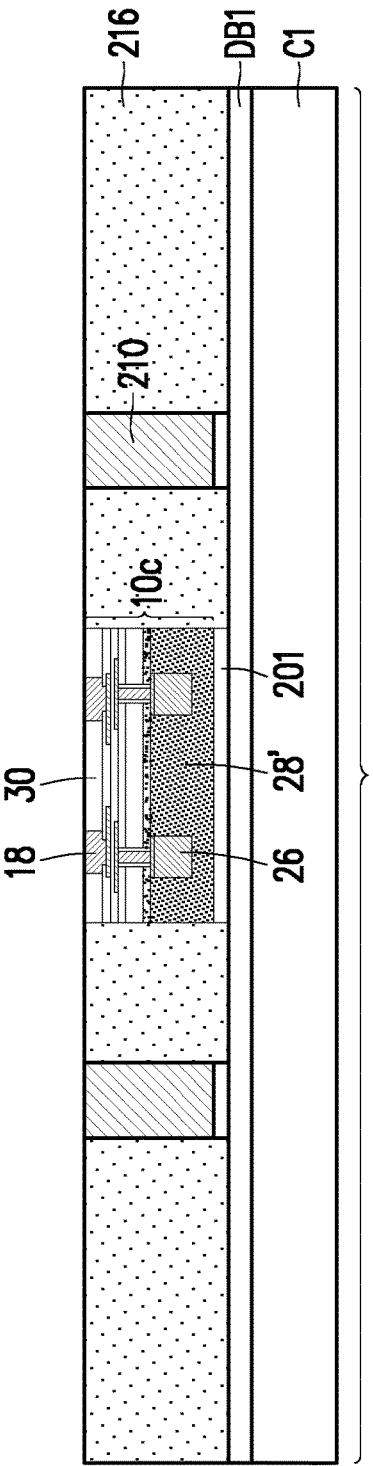

Referring to FIG. 3B, an encapsulant 216 is formed over the carrier C1 to laterally encapsulate sidewalls of the conductive vias 210 and the die 10c. The encapsulant 216 may include a material selected from the same candidate materials of the encapsulant 116 described in the above embodiments, which are not described again here for the sake of brevity.

Referring to FIG. 3A and FIG. 3B, in some embodiments, the encapsulant 216 may be formed by initially forming an encapsulant material layer over the carrier C1 to encapsulate sidewalls and top surfaces of the die 10c and the conductive vias 210, through an over-molding process, for example. Thereafter, a planarization process, such as a CMP process is performed to remove excess portions of the encapsulant material layer and/or a portion of passivation layer 30, such that the conductive vias 210 and the connectors 18 of the die 10c are exposed, and the encapsulant 216 is formed. In some embodiments, portions of the conductive vias 210 and/or portions of the connectors 18 of the die 10c may also be removed during the planarization process. In some embodiments, after the planarization process, the top surface of encapsulant 216, the top surfaces of the conductive vias 210, and the top surface (i.e., front surface) of the die 10c are substantially level or coplanar with each other. The conductive vias 210 penetrates through the encapsulant 216 and may also be referred to as TIVs.

Figure 3C:
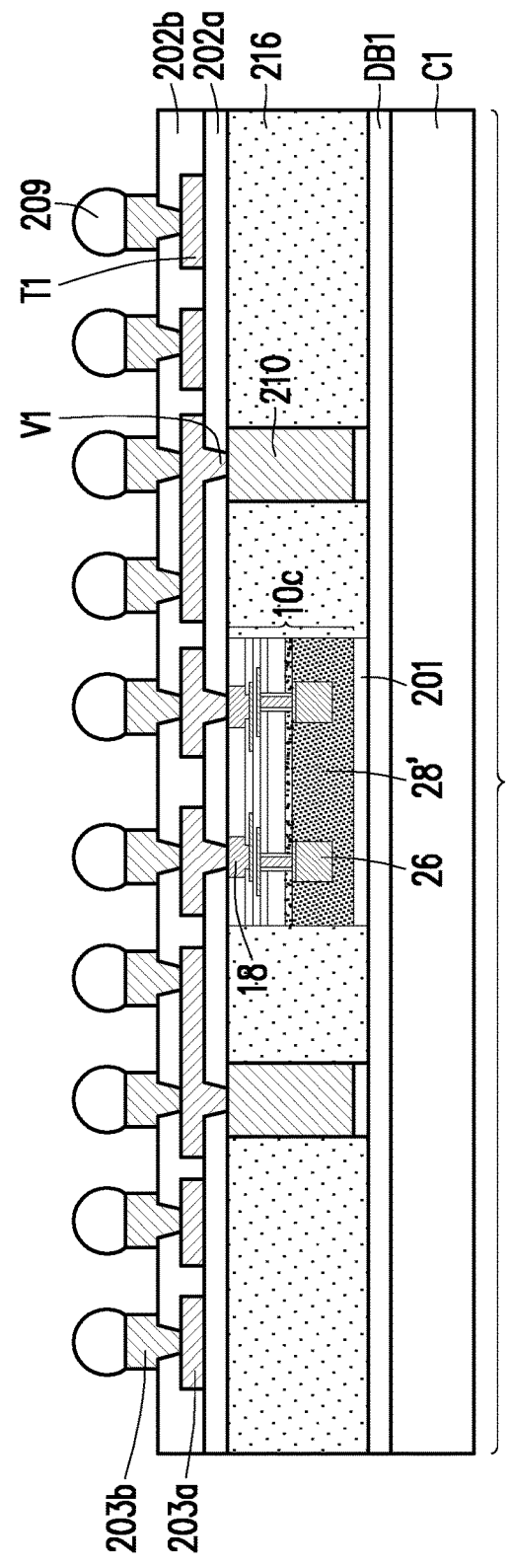

Referring to FIG. 3C, a RDL structure 208 is formed on the die 10c, the conductive vias 210 and the encapsulant 216 to electrically connect to the die 10c and the conductive vias 210. In some embodiments, the RDL structure 208 includes a plurality of polymer layers 202a, 202b and a plurality of redistribution layers 203a, 203b stacked alternatively. It is noted that, the tiers of the polymer layers and/or redistribution layers included in the RDL structure 208 shown in the figures are merely for illustration, and the disclosure is not limited thereto. More or less tiers of polymer layers and/or redistribution layers may also be used.

The redistribution layer 203a penetrates through the polymer layer 202a to be electrically connected to the connectors 18 of the die 10c and the conductive vias 210. The redistribution layer 203b penetrates through the polymer layer 202b to be electrically connected to the redistribution layer 203a. The materials of the polymer layers 202a, 202b and the redistribution layers 203a, 203b may be selected from the same candidate materials of the polymer layers and the redistribution layers of the RDL structure 120 as describe in the above embodiments, which are not described again here. In some embodiments, the redistribution layer 203a includes a plurality of vias V1 and traces T1 connected to each other. The vias V1 are embedded in and penetrating through the polymer layer 202a to connect the traces T1 to the connectors 18 of the die 10c and the conductive vias 210. The traces T1 are extending along the top surface of polymer layer 202a and connected to the vias V1. In some embodiments, the redistribution layer 203b is the topmost redistribution layer of the RDL structure 208, and may include a plurality of via portions and pillar portions connected to each other.

The via portions are embedded in the polymer layer 202b and landing on the redistribution layer 203a. The pillar portions are disposed on the via portions and protruding from the top surface of the polymer layer 202b.

Referring to FIG. 3C, in some embodiments, a plurality of connectors 209 are formed on and electrically connected to the redistribution layer 203b of the RDL structure 208, and further electrically connected to the die 10c and the conductive vias 210 through the RDL structure 208. In some embodiments, the materials of the connectors 209 may include copper, aluminum, lead-free alloys (e.g., gold, tin, silver, aluminum, or copper alloys) or lead alloys (e.g., lead-tin alloys). The connector 209 may be formed by a suitable process such as evaporation, plating, ball dropping, screen printing and reflow process, or the like. In some embodiments, the connectors 209 are solder balls, for example.

Figure 3D:
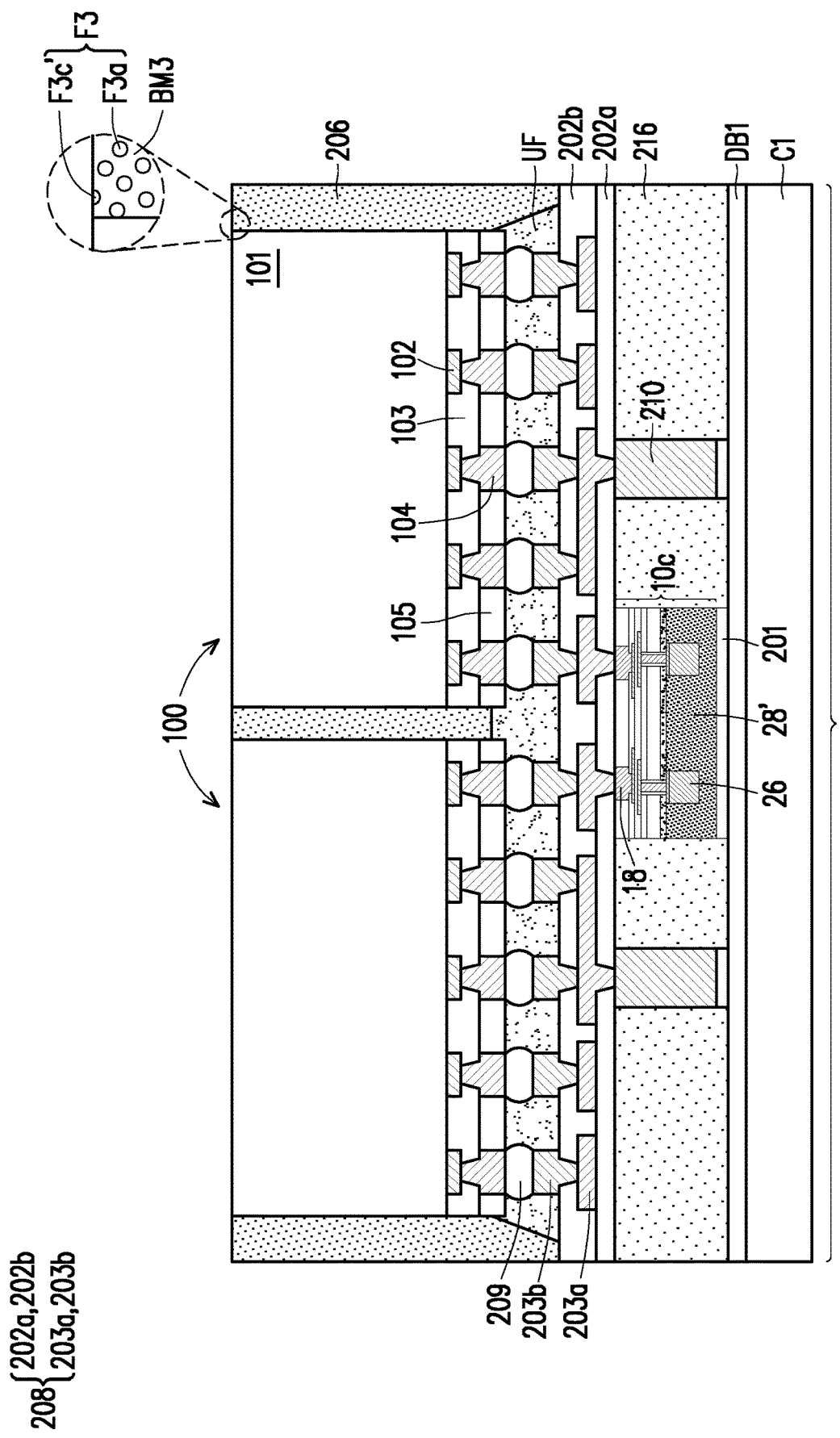

Referring to FIG. 3D, a plurality of dies 100 are electrically bonded to the RDL structure 208 through the connectors 209. In some embodiments, the dies 100 are turned over and faces down, with the front surfaces of the dies 100 facing the RDL structure 209. The dies 100 are substantially the same as the dies 100 described in the above embodiments. In some embodiments, the die 100 includes the passivation layer 105 laterally covering the connectors 104. In some embodiments, the connectors 104 of the dies 100 are electrically connected to the redistribution layer 203b of the RDL structure 208 through the connectors 209. In such embodiments, the dies 100 are electrically connected to the die 10c and the conductive vias 210 through the RDL structure 208.

Figure 5:
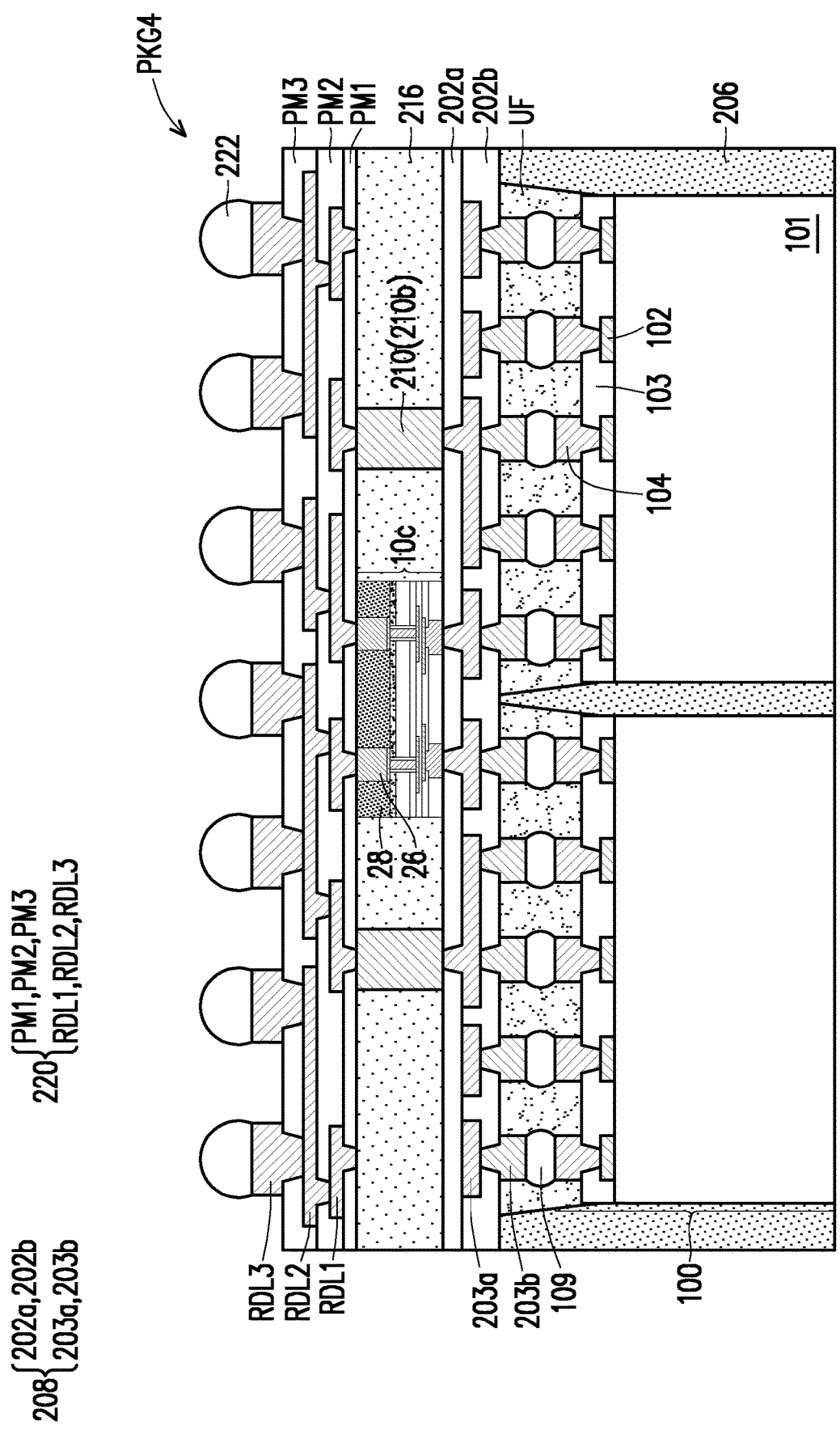

Still referring to FIG. 3D, in some embodiments, an underfill layer UF is formed to fill the space between the dies 100 and the RDL structure 208 and laterally surrounding the connectors 209 and the pillar portions of the redistribution layer 203b. In some embodiments, the underfill layer UF may be formed by performing a dispensing process to apply underfill material between the dies 100 and the RDL structure 208, followed by a curing process to cure the underfill material. In some embodiments, the underfill material between the respective dies 100 and the RDL structure 208 may be merged together, such that the underfill layer UF is a continuous layer extending from the position between a first die 100 and the RDL structure 208, across the gap between the first die 100 and a second die 100, and continuously extending to the positon between the second die 100 and the RDL structure 208. However, the disclosure is not limited thereto. In some alternative embodiments, for example, as shown in FIG. 5, the underfill layer UF may include a plurality of underfill regions respectively disposed between the corresponding dies 100 and the RDL structure 208, without being merged together. In other words, the plurality of the underfill regions may be laterally spaced from each other, and the subsequently formed encapsulant 206 may be disposed laterally between the plurality of underfill regions.

Still referring to FIG. 3D, in some embodiments, an encapsulant 206 is then formed on the RDL structure 208 to encapsulate the dies 100 and the underfill layer UF. The encapsulant 206 may include a material selected from the same candidate materials for the encapsulant 106 described in the above embodiments. In some embodiments, the encapsulant 206 is formed by forming an encapsulant material over the RDL structure 208 through an over-molding process. The encapsulant material encapsulates the sidewalls and top surfaces of the dies 100 and the underfill layer UF. Thereafter, a planarization process is performed to remove excess portions of the encapsulant material over the top surfaces of the dies 100, such that the top surfaces of the dies 100 (i.e., back surfaces of the substrate 101) are exposed. The planarization process may include a grinding process, a polishing process such as CMP, or the like, or combinations thereof. In some embodiments, the top surface of the encapsulant 206 is substantially coplanar with the top surfaces of the dies 100.

In some embodiments, the encapsulant 206 includes a base material BM3 and filler F3 distributed therein. In the present embodiments, due to the planarization process, the encapsulant 206 may include some partially removed fillers F3c' at the top of the encapsulant 206 having flat top surfaces. In some embodiments, the flat top surfaces of the fillers F3c' are substantially coplanar with the top surfaces (i.e. back surfaces) of the dies 100 and are exposed.

Figure 3E:
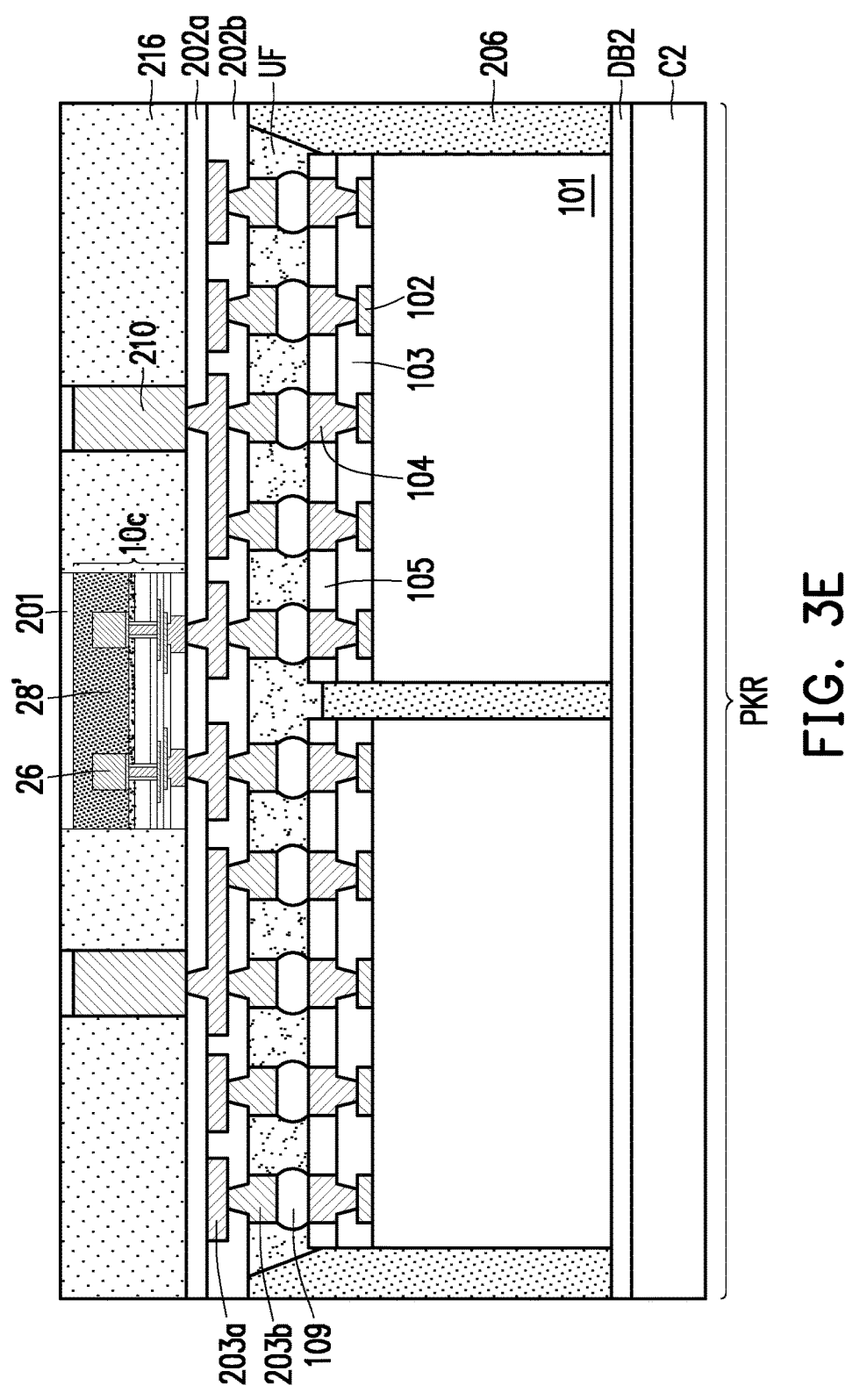

Referring to FIG. 3D and FIG. 3E, in some embodiments, the de-bonding layer DB1 is decomposed under the heat of light, and the carrier C1 is released from the overlying structure. Thereafter, the structure formed in FIG. 3D is flipped upside down and mounted over a carrier C2. The carrier C2 has a de-bonding layer DB2 formed thereon. The materials of the carrier C2 and the de-bonding layer DB2 are substantially the same as those of the carrier C1 and the de-bonding layer DB1, which are not described again here. In some embodiments, the structure formed in FIG. 3D is attached to the carrier C2 through an adhesive layer (not shown), such as DAF, silver paste, or the like.

Referring to FIG. 3E, the surfaces of the encapsulant 206 and the dies 100 are attached to the carrier C2, while the top surfaces of the encapsulant 216, the conductive vias 210 and the adhesive layer 201 are exposed, and the back surface of the die 10c faces up.

Figure 3F:
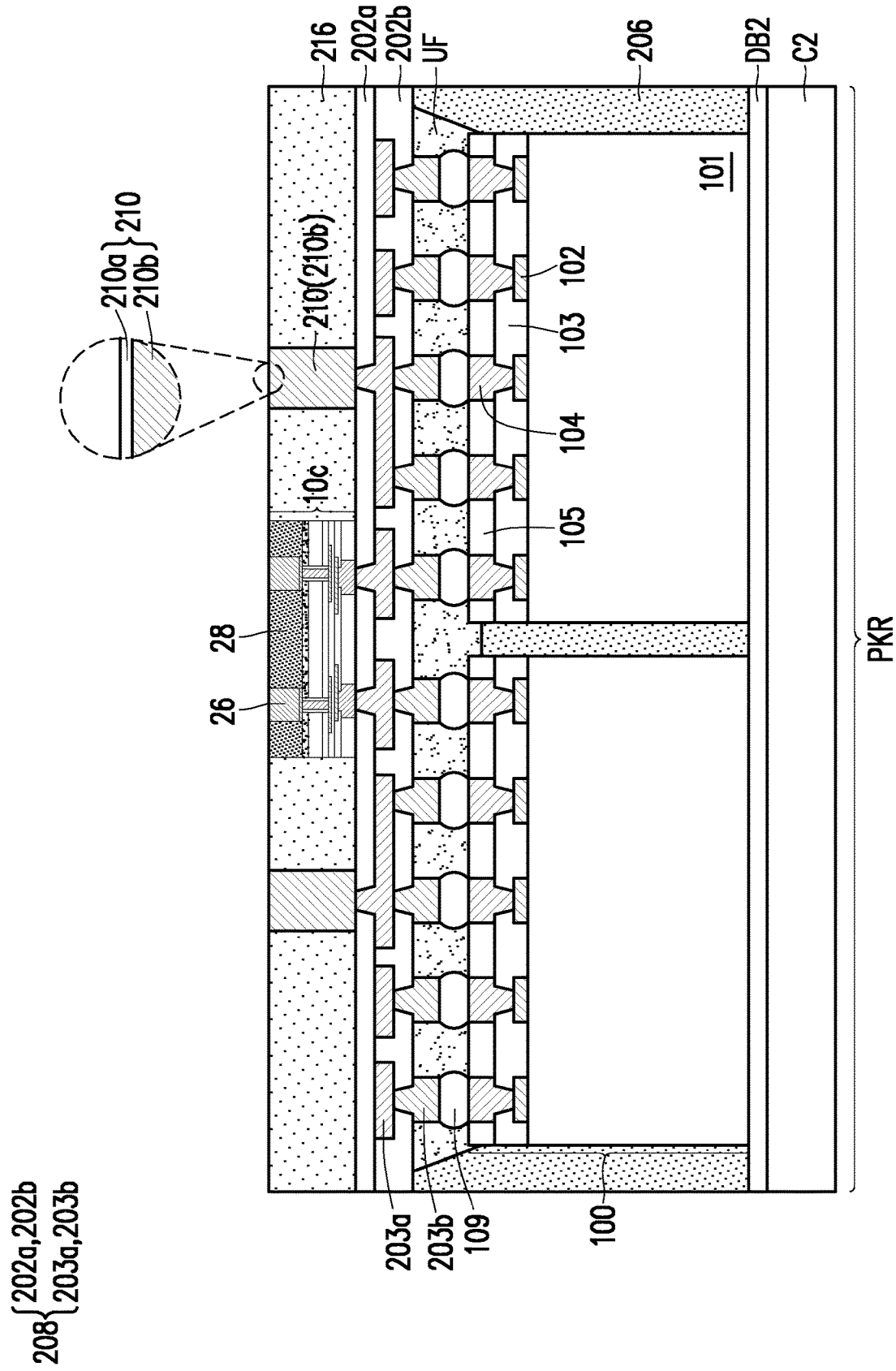

Referring to FIG. 3E and FIG. 3F, in some embodiments, a planarization process may be performed to remove the adhesive layer 201 and a portion of the encapsulant material layer 28' over the top surfaces of the conductive vias 26 of the die 10c, such that the conductive vias 26 of the die 10c are exposed, and an encapsulant layer 28 is formed. In some embodiments, portions of the conductive vias 210 and a portion of the encapsulant 216 laterally aside the adhesive layer 201 and the portion of the encapsulant layer 28 are also removed during the planarization process. The planarization process may include a grinding process, a polishing process such as CMP, or the like, or combinations thereof. In some embodiments, depending on the heights of the conductive vias 210/26, the thickness of the excess portions of the encapsulant material layer 28' over the conductive via 26, and/or the thickness of the adhesive layer 201, the seed layer 210a of the conductive vias 210 may be partially or completely removed by the planarization process. In some embodiments, the seed layer is completely removed, and the top surface of the conductive post 210b is exposed. In other words, after the planarization process, the conductive via 210 may be free of seed layer. However, the disclosure is not limited thereto. In alternative embodiments, as shown in the enlarged view, the seed layer of the conductive via 210 is partially removed, and the top surface of the seed layer is exposed, while the top surface of the conductive post 210b is covered by the seed layer 210a.

Referring to FIG. 3F, in some embodiments, after the planarization process is performed, the top surface of the encapsulant 216, the top surfaces of the conductive vias 210, and the top surface (i.e., back surface) of the die 10c including the top surfaces of the conductive vias 26 and the top surface of the encapsulant layer 28 are substantially level or coplanar with each other.

Figure 3G:
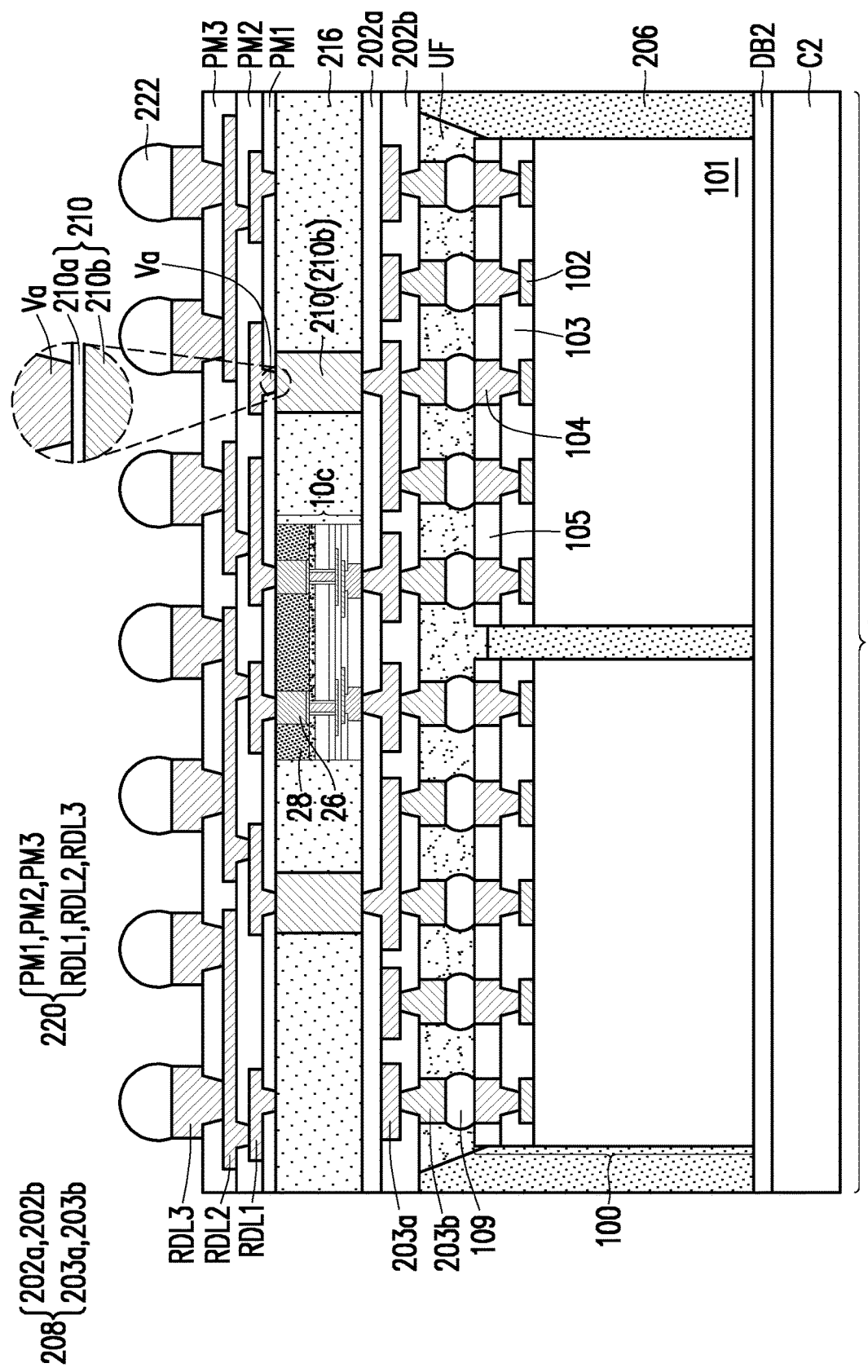

Referring to FIG. 3G, thereafter, a RDL structure 220 is formed on the die 10c, the conductive vias 210 and the encapsulant 216, and electrically connected to the die 10c and the conductive vias 210. In some embodiments, the RDL structure 220 includes a plurality of polymer layers PM1, PM2, PM3 and a plurality of redistribution layer RDL1, RDL2, RDL3 stacked alternatively. The materials, forming method and structural features of the RDL structure 220 are similar to or substantially the same as those of the RDL structure 120 described in the foregoing embodiments, which are not described again here. In the present embodiments, the vias of the redistribution layer RDL1 are landing on the conductive vias 26 of the die 10c and the conductive vias 210. In some embodiments in which the seed layer of the conductive via 210 is completely removed during the planarization process, the conductive via 210 may be free of seed layer, and the via Va of the redistribution layer RDL1 landing on the conductive via 210 is in physical contact with the conductive post 210b of the conductive via 210. In some alternative embodiments in which the seed layer 210a of the conductive via 210 is partially removed during the planarization process, as shown in the enlarged view, the via Va of the redistribution layer RDL1 landing on the conductive via 210 may be in physical contact with the seed layer 210a of the conductive via 210.

Still referring to FIG. 3G, a plurality of connectors 222 are formed on and electrically connected to the redistribution layer RDL3 of the RDL structure 210. The materials and forming method of the connectors 222 may be selected from the same candidate materials and forming methods of the connectors 122 as described in the foregoing embodiment.

As such, a plurality of package structures PKG2 are formed within the plurality of package regions PKR over the carrier C2.

Figure 3H:
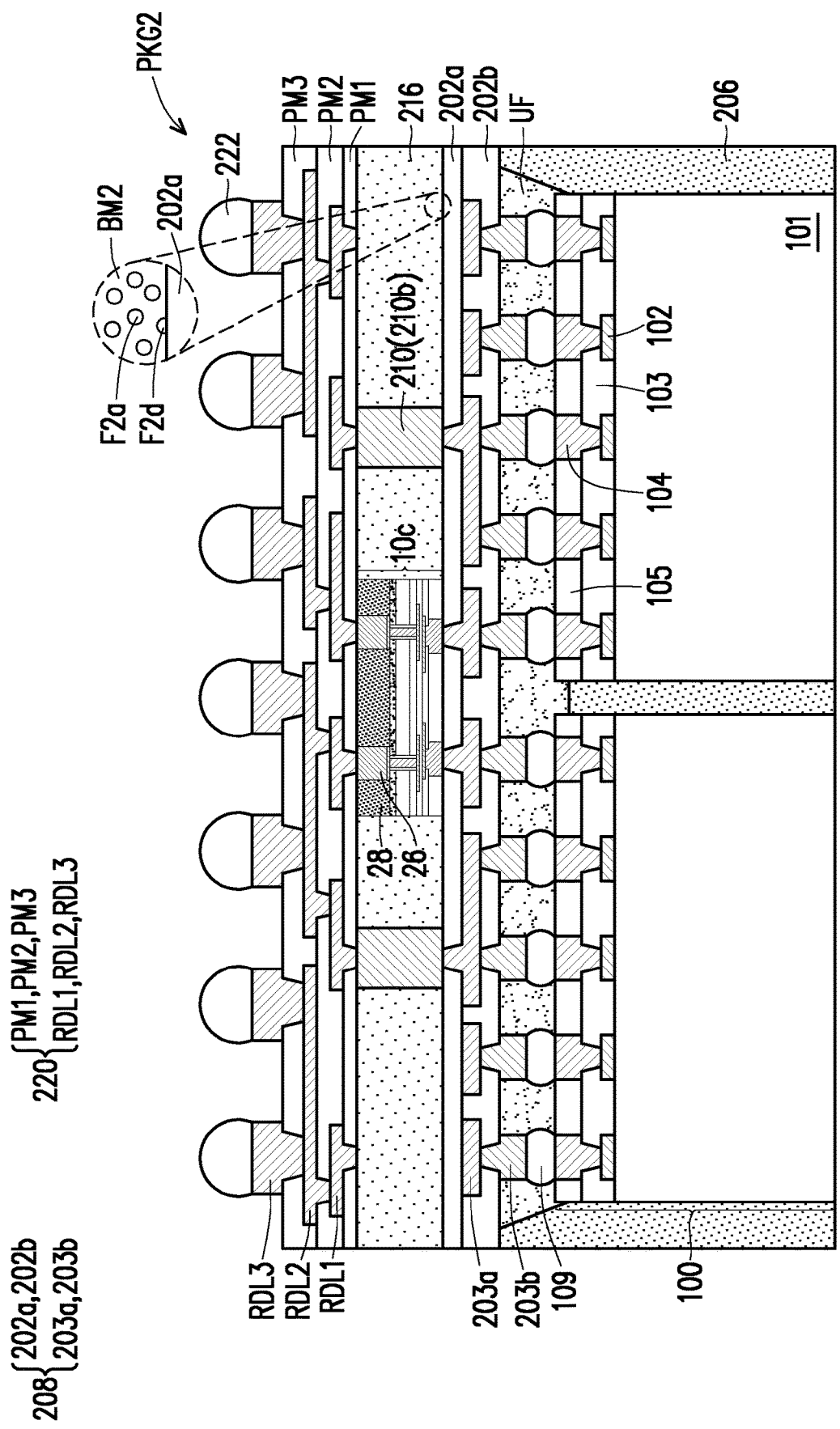

Referring to FIG. 3G and FIG. 3H, in some embodiments, the de-bonding layer DB2 is decomposed under the heat of light, and the carrier C2 is released from the package structures. Thereafter, a singulation process is performed to singulate the package structures PKG2.

Referring to FIG. 3H, in some embodiments, the package structure PKG2 include the dies 100, the underfill layer UF, the encapsulant 206, the RDL structure 208, the bridge die 10c, the TIVs 210, the encapsulant 216, the RDL structure 210, and the connectors 222. In the present embodiments, the bridge die 10c is electrically connected to the dies 100 through the RDL structure 208 disposed therebetween. The top surface of the encapsulant 206 is higher than the top surface (i.e., front surface) of the die 100, and is substantially level or coplanar with the top surface of the underfill layer UF and the surface of the redistribution layer 203b contacting the polymer layer 202b.

The bottom surface of the encapsulant 206 is substantially coplanar with the bottom surfaces (i.e., back surfaces) of the dies 100. Herein, the "back surface" of the die 100 refers to a surface of the substrate 101 that is opposite to the front surface of the die 10c close to or having the connectors 104. As described above, some of the fillers at the bottom surface of the encapsulant 206 include substantially flat surface that is substantially level or coplanar with the back surfaces of the dies 100.

The encapsulant 216 is disposed on the RDL structure 208 and separated from the encapsulant 206 by the RDL structure 208 therebetween. In the present embodiments, both the top surface and bottom surface of the encapsulant 216 were subjected to planarization processes (see FIG. 3B and FIG. 3F), therefore, the encapsulant 216 may have partially removed fillers both at its top surface and bottom surface. In some embodiments, the structural features of the fillers of the encapsulant 216 at the top surface and the fillers of the encapsulant layer 28 included in the package structure PKG2 are substantially the same as those of the package structure PKG1 described above, which are not described again here for the sake of brevity. Besides, in the present embodiments, as shown in the enlarged view, the encapsulant 216 may further include fillers F2d at the bottom thereof. The fillers F2d may be partially removed during the planarization process shown in FIG. 3B and thus have substantially flat bottom surfaces. In some embodiments, the flat bottom surfaces of the fillers F2d are substantially coplanar with bottom surface (i.e., front surface or active surface) of the die 10c and the bottom surfaces of the conductive vias 210, and are in physical contact with the polymer layer 202a of the RDL structure 208.

The RDL structure 208 and the RDL structure 220 are disposed on opposite sides of the bridge die 10c. In some embodiments, the vias of the RDL structures 208 and 220 are tapered toward the bridge die 10c and tapered toward each other. In other words, the vias of the RDL structures 208 and 220 are tapered toward different direction.

The other structural features of the package structure PKG2 are substantially the same as those of the package structures PKG1, which are not described again here.

Figure 4:
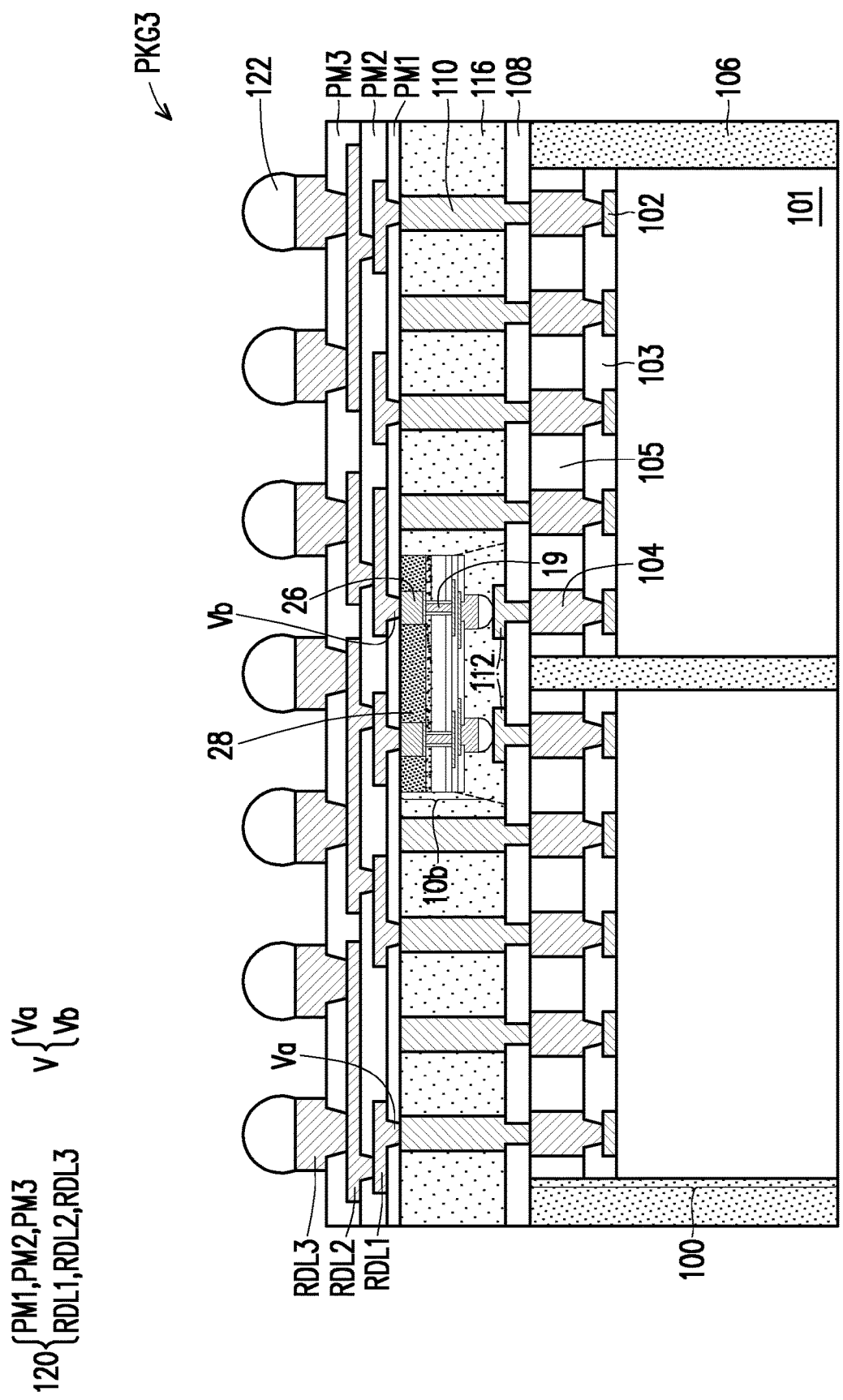
FIG. 4 and FIG. 5 are cross-sectional views illustrating package structures according to some embodiments of the disclosure.

FIG. 4 and FIG. 5 are cross-sectional views illustrating package structures according to some other embodiments of the disclosure.

Referring to FIG. 4, a package structure PKG3 is illustrated. The package structure PKG3 is similar to the package structure PKG1, except that the die 100 included in the package structure PKG3 further include a passivation layer 105 disposed on the passivation layer 103 and laterally covering the connectors 104. In the present embodiments, the connectors 104 are separated from the encapsulant 106 by the passivation layer 105, and the passivation layer 105 is laterally encapsulated by the encapsulant 106. In some embodiments, the top surfaces of the passivation layers 105 and the top surfaces of connectors 104 of the dies 100 are substantially coplanar with the top surface of the encapsulant 106.

Referring to FIG. 5, a package structure PKG4 is illustrated. The package structure PKG4 is similar to the package structure PKG2, except that the die 100 included in the package structure PKG4 is free of passivation layer 105 (FIG. 3H), and the underfill layer UF covers the top surface of the passivation layer 103 and laterally surrounding the connectors 104 of the dies 100.

In the embodiments of the disclosure, bridge die is used for connecting devices dies, which may provide high speed channel between the device dies. The semiconductor substrate of the bridge die includes TSVs embedded therein. Conductive vias are formed on backside of the semiconductor substrate and connected to the TSVs. In the embodiments, the conductive via have larger size than the corresponding TSV, thereby providing a larger window for via landing and benefit for alignment overlay between the conductive via and the overlying via disposed on the conductive via. On the other hand, encapsulant layer is formed on the thinned semiconductor substrate and laterally encapsulates the conductive vias, which is benefit for warpage control of the package structure, and backside silicon chipping free is achieved. Therefore, the reliability and the performance of the package structure may be improved, and the higher yield may be achieved.

In accordance with some embodiments of the disclosure, a package structure includes a first die and a second die disposed side by side, a first encapsulant, a bridge die, a second encapsulant and a first RDL structure. The first encapsulant laterally encapsulates the first die and the second die. The bridge die is disposed over and connected to the first die and the second die. The bridge die includes a semiconductor substrate, a conductive via and an encapsulant layer. The semiconductor substrate has a through substrate via embedded therein. The conductive via is disposed over a back side of the semiconductor substrate and electrically connected to the through substrate via. The encapsulant layer is disposed over the back side of the semiconductor substrate and laterally encapsulates the conductive via. The second encapsulant is disposed over the first encapsulant and laterally encapsulates the bridge die. The first RDL structure is disposed on the bridge die and the second encapsulant.

In accordance with alternative embodiments of the disclosure, the package structure includes a first die and a second die disposed side by side, a first encapsulant, a bridge die, a second encapsulant and a RDL structure. The first encapsulant laterally encapsulates sidewalls of the first die and the second die. The bridge die is disposed over and electrically connected to the first die and the second die. The bridge die includes a substrate structure, a first conductive via and a second conductive via. The substrate structure includes a first substrate portion and a second substrate portion on the first substrate portion. The first conductive via is embedded in the first substrate portion and connected to an interconnection structure. The second conductive via penetrates through the second substrate portion and is electrically connected to the first conductive via. A top surface area of the second conductive via is larger than the top surface area of the first conductive via. The second encapsulant laterally encapsulates the bridge die. The RDL structure is disposed over the second encapsulant and the bridge die, wherein a via of the RDL structure is landing on the second conductive via of the bridge die.

In accordance with some embodiments of the disclosure, a method of forming a package structure includes: forming a bridge die; providing a first die and a second die disposed side by side, and forming a first encapsulant to laterally encapsulate the first die and the second die; electrically connecting the bridge die to the first die and the second die; forming a second encapsulant to laterally encapsulate the bridge die; and forming a RDL structure over the second encapsulant and the bridge die. The formation of the bridge die includes: providing an initial die comprising a semiconductor substrate and a through substrate via embedded in the semiconductor substrate; forming a conductive via over a back side of the semiconductor substrate to electrically connect to the through substrate via; and forming an encapsulant layer over the back side of the semiconductor substrate to encapsulate the conductive via.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
an insulating encapsulant;
through insulator vias penetrating through the insulating encapsulant;
a bridge die, laterally wrapped by the insulating encapsulant and surrounded by the through insulator vias; and
a first die and a second die, disposed side-by-side and disposed over the insulating encapsulant, wherein the bridge die electrically connects the first die and the second die, and the bridge die includes:
a semiconductor substrate;
an interconnection structure disposed on the semiconductor substrate;
through substrate vias, embedded in the semiconductor substrate and connected to the interconnection structure; and
conductive vias, wrapped by an encapsulant layer and connected to the through substrate vias.

2. The package structure of claim 1, wherein the bridge die further comprises an isolation layer disposed between the semiconductor substrate and the encapsulant layer.

3. The package structure of claim 1, wherein the conductive via has a width larger than that of the through substrate via, and surfaces of the through insulator vias and the insulating encapsulant are coplanar and substantially levelled with surfaces of the conductive vias and the encapsulant layer.

4. The package structure of claim 1, further comprising a redistribution layer structure disposed on the bridge die and the insulating encapsulant.

5. The package structure of claim 1, further comprising an encapsulant disposed over the insulating encapsulant and laterally wrapping the first die and the second die.

6. The package structure of claim 5, further comprising a dielectric layer, disposed between the insulating encapsulant and the encapsulant, and conductive pads penetrating through the dielectric layer.

7. The package structure of claim 6, wherein the bridge die includes connectors disposed between the conductive pads and the bridge die, and the bridge die is electrically connected to the first die and the second die through the connectors and the conductive pads.

8. The package structure of claim 5, further comprising a redistribution layer structure disposed between the encapsulant and the insulating encapsulant, wherein the bridge die is electrically connected to the first die and the second die through the redistribution layer structure.

9. A package structure, comprising:
an insulating encapsulant;
a bridge die, laterally wrapped by the insulating encapsulant;
a first die and a second die, disposed side-by-side and disposed over the insulating encapsulant and the bridge die;
an encapsulant, disposed over the insulating encapsulant and the bridge die, and laterally encapsulating sidewalls of the first die and the second die,
wherein the bridge die electrically connects the first die and the second die, and the bridge die includes:
a substrate structure comprising a semiconductor portion and an insulator portion on the semiconductor portion;
a first conductive via, embedded in the semiconductor portion and connected to an interconnection structure; and
a second conductive via, penetrating through the insulator portion and electrically connected to the first conductive via, wherein a top surface area of the second conductive via is larger than a top surface area of the first conductive via.

10. The package structure of claim 9, further comprising through insulator vias (TIVs) disposed beside the bridge die, extending through the insulating encapsulant and laterally wrapped by the insulating encapsulant, and electrically connected to the first die and the second die, wherein surfaces of the TIVs and the insulating encapsulant are coplanar and substantially levelled with surfaces of the second conductive via and the insulator portion.

11. The package structure of claim 10, wherein the TIVs comprise conductive posts and free of seed layer.

12. The package structure of claim 10, wherein each of the TIVs comprises a seed layer and a conductive post disposed on the seed layer.

13. The package structure of claim 10, further comprising a first redistribution layer (RDL) structure disposed on the insulating encapsulant, the bridge die and through insulator vias.

14. The package structure of claim 13, wherein at least one via of the first RDL structure is connected to one TIV of the TIVs.

15. The package structure of claim 13, wherein at least one via of the first RDL structure is connected with the second conductive via of the bridge die and electrically connected to the bridge die through the second conductive via.

16. The package structure of claim 9, further comprising a dielectric liner disposed between the insulator portion and the semiconductor portion, and wherein the first conductive via penetrates through the dielectric liner.

17. A method of forming a package structure, comprising:
providing a semiconductor substrate having a through substrate via formed in the semiconductor substrate and an interconnection structure formed on the semiconductor substrate;
thinning the semiconductor substrate to expose an end of the through substrate via;
forming a conductive via on the exposed end of the through substrate via;
forming an encapsulant layer over the thinned semiconductor substrate to encapsulate the conductive via to form a bridge die;
disposing a first die and a second die side by side;
forming a first encapsulant to laterally encapsulate the first die and the second die;
providing through insulator vias and disposing the bridge die in-between the through insulator vias;
forming a second encapsulant to encapsulate the bridge die and the through insulator vias; and
performing a planarizing process to partially remove the second encapsulant and the encapsulant layer of the bridge die to expose the through insulator vias and the conductive via of the bridge die.

18. The method of claim 17, wherein before forming the conductive via and after thinning the semiconductor substrate, the method further comprises:
recessing the semiconductor substrate, such that a portion of the through substrate via protrudes from a top surface of the semiconductor substrate; and
forming an isolation layer covering the top surface of the semiconductor substrate but exposing the through substrate via.

19. The method of claim 17, further comprising forming a redistribution layer structure over the second encapsulant and the bridge die, wherein the bridge die is electrically connected with the redistribution layer structure.

20. The method of claim 19, further comprising forming connectors on the redistribution layer structure.

* * * * *